US008851820B2

(12) United States Patent
Bonora et al.

(10) Patent No.: US 8,851,820 B2
(45) Date of Patent: Oct. 7, 2014

(54) SUBSTRATE CONTAINER STORAGE SYSTEM

(75) Inventors: Anthony C. Bonora, Portola Valley, CA (US); Richard H. Gould, Fremont, CA (US); Michael Krolak, Los Gatos, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 694 days.

(21) Appl. No.: 12/780,761

(22) Filed: May 14, 2010

(65) Prior Publication Data

US 2010/0290872 A1 Nov. 18, 2010

Related U.S. Application Data

(60) Provisional application No. 61/216,570, filed on May 18, 2009.

(51) Int. Cl.
*B65G 1/12* (2006.01)
*H01L 21/677* (2006.01)

(52) U.S. Cl.
CPC ...... *H01L 21/6773* (2013.01); *H01L 21/67769* (2013.01); *Y10S 414/14* (2013.01)
USPC ................... 414/331.03; 198/465.2; 198/799; 414/217.1; 414/940

(58) Field of Classification Search
USPC ................... 414/217.1, 223.01, 331.03, 940; 198/346.1, 370.1, 463.3, 465.2, 799, 198/800
See application file for complete search history.

(56) References Cited

U.S. PATENT DOCUMENTS

| 4,273,234 | A | * | 6/1981 | Bourgeois | 198/347.3 |
| 4,531,789 | A | * | 7/1985 | Iemura et al. | 198/799 |
| 4,926,999 | A | * | 5/1990 | Fauth et al. | 198/358 |
| 5,238,100 | A | * | 8/1993 | Rose et al. | 198/468.6 |
| 5,337,880 | A | | 8/1994 | Claycomb et al. | 198/347.3 |
| 5,447,407 | A | | 9/1995 | Weaver et al. | 414/528 |
| 5,884,753 | A | * | 3/1999 | Robertson et al. | 198/803.2 |
| 5,980,183 | A | | 11/1999 | Fosnight | 414/222.01 |
| 6,158,566 | A | * | 12/2000 | Pollock | 198/347.3 |
| 6,336,546 | B1 | | 1/2002 | Lorenz | 198/346.2 |

(Continued)

FOREIGN PATENT DOCUMENTS

| FR | 2583024 A1 * 12/1986 | 414/331.03 |
| JP | 2004-307125 A 11/2004 | B65G 1/133 |

(Continued)

*Primary Examiner* — James Keenan
(74) *Attorney, Agent, or Firm* — Martine Penilla Group, LLP

(57) ABSTRACT

A storage system and methods for operating a storage system are disclosed. The storage system includes a storage system assembly positioned at a height that is greater than a height of a tool used for loading and unloading substrates to be processed. The storage system locally stores one or more containers of substrates. The storage system assembly includes a plurality of storage shelves, and each of the plurality of storage shelves have shelf plates with shelf features for supporting a container. Each of the plurality of storage shelves are coupled to a chain to enable horizontal movement and each is further coupled to a rail to enable guiding to one or more positions. A motor is coupled to a drive sprocket for moving the chain, such that each of the plurality of storage shelves move together along the rail to the one or more positions. The rail has at least some sections that are linear and some sections that are nonlinear and the sections are arranged in a loop.

36 Claims, 22 Drawing Sheets

(56) References Cited

U.S. PATENT DOCUMENTS

| | | | |
|---|---|---|---|
| 6,439,822 B1 * | 8/2002 | Kimura et al. | 414/331.04 |
| 6,447,232 B1 * | 9/2002 | Davis et al. | 414/217.1 |
| 6,572,321 B1 | 6/2003 | Nulman | 414/416.05 |
| 6,582,174 B1 * | 6/2003 | Hayashi | 414/217 |
| 6,877,944 B2 | 4/2005 | Peiter | 414/279 |
| 6,957,941 B2 * | 10/2005 | Hart et al. | 414/331.03 |
| 7,165,927 B2 * | 1/2007 | Doherty et al. | 414/331.02 |
| 7,258,223 B2 * | 8/2007 | Strange | 198/465.2 |
| 7,410,340 B2 | 8/2008 | Bonora et al. | 414/217.1 |
| 7,445,415 B2 | 11/2008 | Bonora et al. | 414/217.1 |
| 7,478,720 B2 * | 1/2009 | Bernhard et al. | 198/346.1 |
| 7,648,018 B2 * | 1/2010 | Inui | 198/463.3 |
| 7,651,307 B2 * | 1/2010 | Bonora et al. | 414/217.1 |
| 7,704,031 B2 * | 4/2010 | Mitsuyoshi | 414/217 |
| 7,740,437 B2 * | 6/2010 | De Ridder et al. | 414/217.1 |
| 7,771,151 B2 * | 8/2010 | Bonora et al. | 414/217.1 |
| 8,277,161 B2 * | 10/2012 | Aburatani et al. | 414/217 |
| 2004/0109746 A1 * | 6/2004 | Suzuki | 414/373 |
| 2006/0188358 A1 | 8/2006 | Bonora et al. | 414/217 |
| 2006/0188360 A1 | 8/2006 | Bonora et al. | 414/217.1 |
| 2007/0134078 A1 | 6/2007 | Rogers et al. | 414/281 |
| 2008/0267742 A1 | 10/2008 | Bonora et al. | 414/217 |
| 2009/0003977 A1 | 1/2009 | Aburatani et al. | |

FOREIGN PATENT DOCUMENTS

| | | | |
|---|---|---|---|
| JP | 2005-150129 A | 6/2005 | B65G 1/04 |
| JP | 2005-530361 | 10/2005 | H01L 21/677 |
| JP | 2008-160076 | 7/2008 | |
| JP | 2008-546180 | 12/2008 | |
| JP | 2009-010009 | 1/2009 | |
| JP | 2009-094460 A | 1/2009 | B29C 65/16 |
| KR | 10-2007-0098033 A | 5/2007 | |
| KR | 10-2007-0116027 | 12/2007 | H01L 21/00 |
| KR | 10-2008-0025068 | 3/2008 | H01L 21/67 |
| WO | WO 2006-035473 A1 | 4/2006 | H01L 21/68 |

* cited by examiner

SUBSTRATE CONTAINER STORAGE SYSTEM

CLAIM OF PRIORITY

This application claims priority under 35 USC 119(e) to U.S. Provisional Application No. 61/216,570, filed on May 18, 2009, entitled "Horizontal Recirculating Storage System for Substrate Containers", and is herein incorporated by reference.

BACKGROUND

There are several ways that semiconductor wafer containers are stored in a semiconductor fabrication facility ("fab"). Large centralized stockers can store the containers of wafers until they are needed for processing, receiving the containers from a transport system known as an Automated Material Handling System ("AMHS") at an input port. In general, an AMHS is any computer controlled system in a factory that moves work pieces between work stations, and between work stations and storage locations. In a fab, an AMHS will move containers of wafers and empty containers between process equipment, metrology equipment and stockers. When processing is required for the wafers, they are retrieved in their container from their storage shelf by a robotic mechanism ("stacker robot"), delivered to an output port on the stocker, picked up by the AMHS, and delivered to the desired processing station. The stacker robot typically requires a large space between the walls of stationary storage shelves. The space is needed to allow for operating clearance and motion of the stacker robot and its container payload. There may also be one or more ports where human operators can manually deliver and retrieve containers from the stocker.

To better distribute the storage of containers, smaller stockers may be located in processing bays of the fab where the containers can be stored closer to their next processing station, reducing delivery time and travel distance for the containers when they are requested for the next processing operation. Also, distributing the smaller stockers reduces the problem of AMHS traffic congestion at the large stockers and the throughput limitations of the single stacker robot at the large stocker, however the distribution and use of smaller stockers has its limitations. A smaller stocker still has the elements of a large stocker, including the stacker robot and its operating clearance space, controls, and input/output ports. This duplication makes the small, distributed stockers more costly than the large stockers for the same overall number of storage locations. Some fabs are structured with parallel aisles ("bays") of semiconductor processing, measuring or handling equipment ("tools"). If multiple small stockers were placed in each bay adjacent to the tools there would also be an increase in the floor space used for the fab's storage requirements due to the decreased storage density of a small stocker and access clearance required around the stocker and tool. Floor space is very valuable in a fab because it is used for processing tools that manufacture products, therefore it is desirable to minimize the use of floor space for storage functions.

Therefore, there is a need for container storage systems that are simple and inexpensive, using minimal floor space, while providing high density container storage close to processing tools.

SUMMARY OF THE INVENTION

One aspect of the present invention is a compact and simple system for storing containers in a horizontal plane. The containers are stored on storage shelves that can be circulated on a loop.

Another aspect of the present invention is to provide a storage system that does not use floor space. The system can be installed above floor mounted facilities and tools. In some cases, parts or sections of a tool may be above the storage system, however, the storage system will still be above the primary functional part of the tool. For instance, if the tool is one or more load ports, the storage system will still be located "above" the tool, even if some component of the tool is above the storage system. And, the term "above" should be understood to generically be a height that is greater than a height of the tool, e.g., the functional part of the tool. In this manner, the storage system can either be directly over (e.g., aligned) or not directly over the tool (e.g., not aligned), so long as the storage system is at the height that is greater than the tool. As used herein, a height can be measured relative to reference surface. The "reference surface" is, in one embodiment, a floor of a room, such as a clean room, factory or laboratory.

Another aspect of the present invention is to provide a storage system that does not interfere with access to floor mounted facilities and tools. The system can be installed between tools but at an elevation above the tools that allows for the unhindered access to the sides of the tools for maintenance and operation.

Another aspect of the present invention is to provide a storage system that has a greater container storage density than conventional stockers due to the elimination of the large clearance space required for a stacker robot.

Another aspect of the present invention is to provide a storage system that can interface with the AMHS of a fab.

Another aspect of the present invention is to provide a storage system with fast access to stored containers.

Another aspect of the present invention is to provide a storage system with active ports that can reduce delays in accessing the stored containers and provide a flexible interface to an AMHS.

Another aspect of the present invention is to provide a storage system with active ports that provides clear access via OHT to a loadport below when the active port is retracted.

Another aspect of the present invention is to provide a storage system with multiple levels of storage shelves. Each level of the storage system circulates storage shelves on a loop and has one or more active ports.

Yet another aspect of the present invention is to provide a storage system that can be mounted above a tool to provide local storage of containers used by the tool.

Still another aspect of the present invention is to provide a storage system that uses active ports and a hoist, or other mechanism, to transfer containers between the storage system and the tool without the aid of an AMHS.

Yet another aspect of the present invention is to provide a storage system that uses active ports and a hoist, or other mechanism, to transfer containers between the storage system and the tool while still allowing the AMHS to deliver and retrieve containers to/from the tool.

In still another embodiment, a storage system is disclosed. The storage system includes a storage system assembly positioned at a height that is greater than a height of a tool used for handling substrates to be processed. The storage system is configured to locally store one or more containers of substrates before or after being processed by the tool. The storage system assembly includes a frame and a base plate coupled to the frame. The base plate includes a drive pulley, an idler pulley, a belt, a track and a motor. Further included are a plurality of storage shelves, where each of the plurality of storage shelves have shelf plates with shelf features for supporting a container, and each of the plurality of storage shelves is coupled to the belt to enable movement and being coupled to the track to enable guiding to one or more positions. The motor is coupled to the drive pulley for moving the belt, such that each of the plurality of storage shelves move together along the track to the one or more positions. The track has at least some sections that are linear and some sections that are nonlinear and the sections are arranged in a loop over the base plate.

In still a further aspect, the storage system includes an active port assembly connected to the frame of the storage system assembly. The active port assembly has a port plate positioned at one of the positions along the track. The active port assembly further includes a horizontal motion assembly defining an extended position outside of the frame and a retracted position inside the frame. Also included is a vertical motion assembly. The vertical motion assembly is coupled to the port plate having port features, and the vertical motion assembly defines an up position and a down position. The horizontal motion assembly is coupled to the vertical motion assembly, wherein the retracted position places the port plate under one of the shelf plates when in the down position, and wherein the retracted position places the port plate above one of the shelf plates when in the up position.

In yet a further aspect, a storage system is disclosed. The storage system includes a storage system assembly positioned at a height that is greater than a height of a tool used for loading and unloading substrates to be processed. The storage system is configured to locally store one or more containers of substrates. The storage system assembly includes a plurality of storage shelves, where each of the plurality of storage shelves have shelf plates with shelf features for supporting a container, and each of the plurality of storage shelves being coupled to a belt to enable horizontal movement and each is coupled to a rail to enable guiding to one or more positions. And also included is a motor coupled to a drive pulley for moving the belt, such that each of the plurality of storage shelves move together along the rail to the one or more positions. The rail has at least some sections that are linear and some sections that are nonlinear and the sections are arranged in a loop.

In one optional configuration, the storage system may include an active port assembly having a port plate positioned at one of the positions along the rail. The active port assembly includes (i) a horizontal motion assembly defining an extended position and a retracted position; and (ii) a vertical motion assembly coupled to the port plate having port features, and the vertical motion assembly defining an up position and a down position, the horizontal motion assembly being coupled to the vertical motion assembly.

DETAILED DESCRIPTION

The descriptions of the embodiments of this invention describe the use of a Front Opening Unified Pod ("FOUP") for the storage of semiconductor wafers in a fab, however, the present invention is not limited to FOUPs and/or semiconductor manufacturing. For purposes of describing this invention, other examples include wafer containers (with walls and without), Substrate containers (with walls and without), cassettes, flat panel display cassettes, Standard Mechanical Interface ("SMIF") pods, reticle pods, or any structure for supporting a substrate, whether the structure supports a single substrate or multiple substrates, or whether the structure is in an enclosing container or the structure is open to the external environment.

Figure 1:
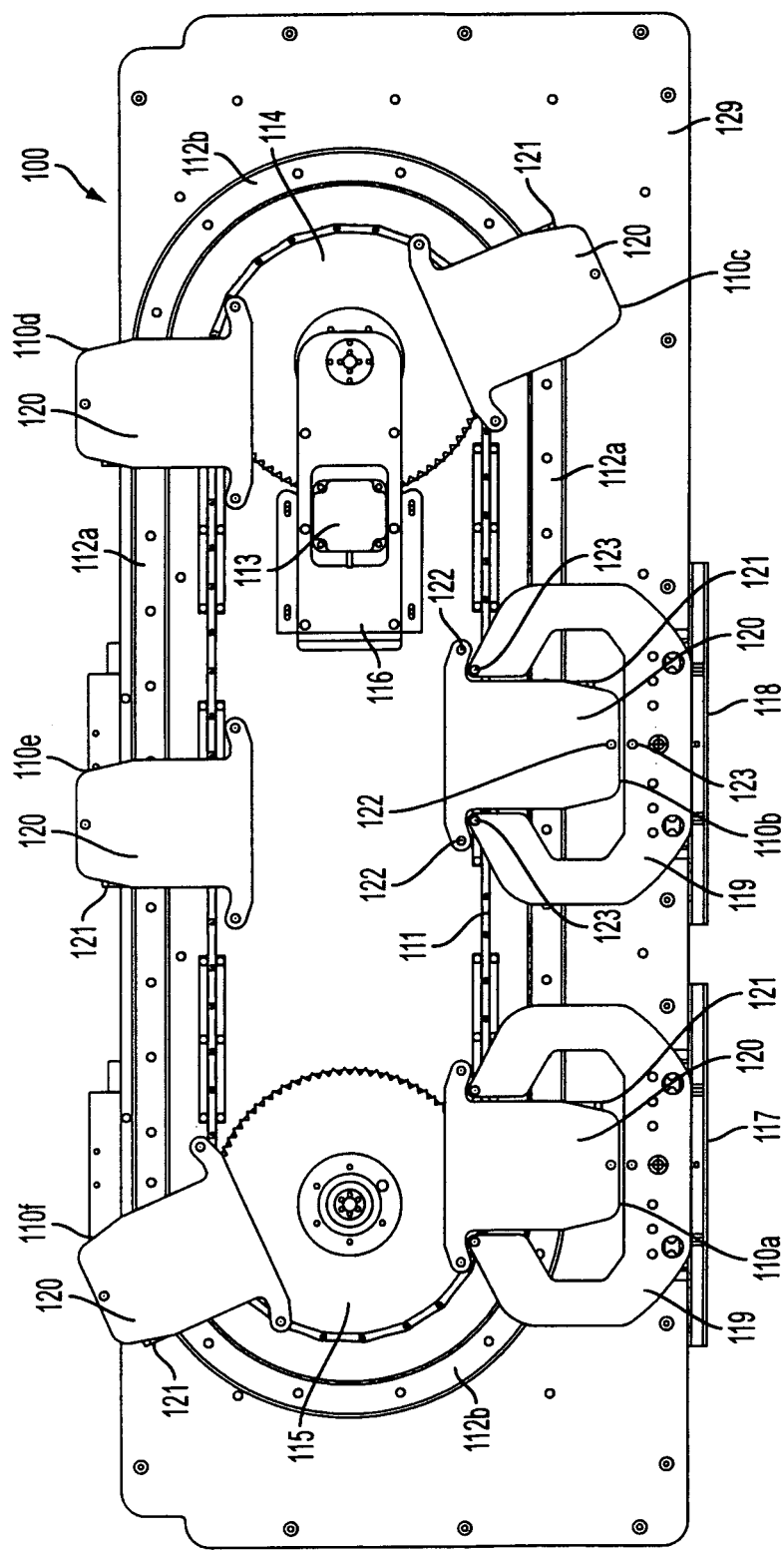
FIG. 1 is a plan view of the present invention including active ports.

One embodiment of the present invention is shown in FIG. 1. Storage system 100 has 6 movable storage shelves 110a-110f. Each storage shelf is connected to drive chain 111 through a vertical pin that is attached to a link of the chain. The pin mates with a slot in the underside of the storage shelf assembly, however, the slot, which is oriented perpendicular to the direction of chain motion, is large enough to allow the pin to rotate and slide without binding. The horizontal motion of the storage shelves is guided by rail 112 which is engaged with a bearing truck under the shelf assembly. Rail 112 has straight sections 112a and curved sections 112b. As the chain 111 moves it pulls the storage shelf by engagement of the pin in the slot, while the rail and bearing truck keep the shelf on a constrained path around the oval configuration of rail sections. It should also be understood that the configuration of the track need not be "oval", and many configurations are possible. In one embodiment, any configuration that defines a loop is envisioned and the loop can have some sections that are linear and some sections that are non-linear. Accordingly, the oval configuration example is just that, an example.

There are other methods of engaging the storage shelf with the chain. For example, a sheet metal bracket with a hole or slot could be fastened to the chain. The hole or slot on the bracket would engage a fixed pin or other feature on the storage shelf. Any other type of engagement hardware would be acceptable if it provided adequate flexibility between the drive chain and the storage shelf while still being able to pull the storage shelf with the drive chain.

While this embodiment uses sprockets and a drive chain for the drive means, other drive components are commercially available and they could be used alternatively. These alternate drives include, but are not limited to; timing belts and pulleys, plastic chain and sprockets, or steel belts and pulleys. The pulleys can be plastic disks, and the belts can be plastic, rubber, smooth, ribbed, pebbled, continuous, segmented, etc. In still other embodiments, the belts and pulleys can be configured below the base plate 129 or in its separate compartment to reduce dust.

The storage system in FIG. 1 moves storage shelves in a loop. A loop is a continuous guidance path for a storage shelf that will repeat if moved in any direction. For example, if storage shelf 110a started in the position shown in FIG. 1 and drive sprocket was rotated in the counter-clockwise direction, storage shelf 110a would pass through the positions shown for shelves 110b through 110f until it returned to its original starting position, as shown in the figure. All of the shelves would be moving simultaneously in the same direction in this case, and all must move at the same time. One shelf can not move without having all shelves move in the loop. The loop shown in FIG. 1 approximates an oval, however, a loop can have any shape and it is possible to have a loop that moves in both directions.

Motor 113 turns drive sprocket 114 through a timing belt (not shown) that allows the motor to be mounted to the side of the sprocket. Alternatively, the motor could have a gearhead and be coupled directly to the center of the sprocket. Other methods to couple the motor to the sprocket are known in the art and could alternatively be used. The motor in this embodiment is a step motor that moves to its desired position without the feedback of a position measuring device such as an optical encoder, however, other types of motors could be used, such as a brushless DC servo motor with a rotary encoder. The step motor moves to its desired position by a pre-determined number of small increments in its electrical phases. In this way the step motor can accurately move to its position without a feedback device to measure the position. A brushless DC servo motor uses a feedback device such as an optical rotary encoder to control the trajectory of motion, and to stop at the desired position.

Drive chain 111 wraps around both drive sprocket 114 and idler sprocket 115. Base plate 129 provides a support structure for mounting the system components. Drive sprocket 114 and idler sprocket 115 have bearing assemblies at their centers that connect them to the base plate yet allow them to freely rotate. Motor 113 is connected to the base plate with motor mount 116.

Base plate 129 is shown as a continuous solid plate but represents any planar structure that can support the system components. For example, the base plate could be made from multiple plates, or folded sheetmetal, or sheetmetal supported by a frame, or a grid structure of frame members. The base plate could have substantial vacant areas to allow vertical airflow in a fab cleanroom.

Motor 113 is electrically connected to control circuits (not shown). The circuits in this embodiment are a step motor amplifier and a microprocessor based controller. The step motor amplifier is connected to the motor wires and provides the drive power to rotate the motor in response to control signals from the microprocessor based controller. The microprocessor based controller executes a sequence of program instructions that control the motion trajectory and position of the motor, and interfaces with external systems such as the fab control system, the tool control system, or a operator interface to determine if and how the storage shelves should be moved.

Other alternative control circuits could be used to control the motor such as a Programmable Logic Controller ("PLC"), a Personal Computer ("PC") with motor amplifier, or custom designed embedded control PC board with microprocessor and integrated motor drive circuit.

Another alternative would have one controller, with its own program sequence, controlling the motor, and another controller, with its own program sequence, interfacing with external systems. These two controllers would coordinate their operation through serial or parallel communication lines. It is possible to have the controls divided amongst any number of separate controllers, however, having one microprocessor based controller running a single program sequence is the simplest way to control the complete storage system.

The control circuit can interface with external systems using different methods. For example, it could communicate with the fab control network using Ethernet following the Semiconductor Equipment and Materials International ("SEMI") E88 standard for stocker interface. Alternatively, it could communicate with the fab or tool control system using Ethernet or an RS232 type of serial communications. It could even communicate with external systems through a set of parallel signal lines. The types of communication used in a fab are various and the present invention could embody different types depending on the control architecture and needs of the fab.

Figure 7:
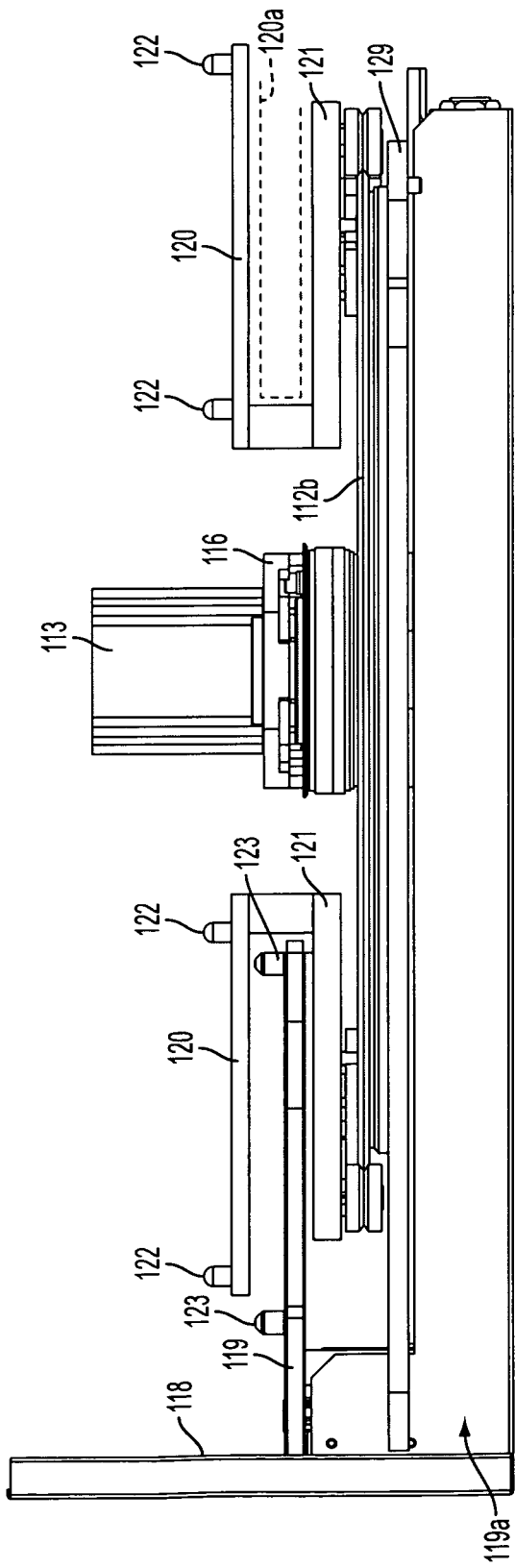
FIG. 7 is a side view of a storage shelf with a retracted active port.

FIG. 1 also shows active ports 117 and 118 in their retracted position. The active ports are mechanisms that can be used to either load a FOUP on to a storage shelf or unload a FOUP from a storage shelf. The active port can move horizontally to either the retracted or extended position. The active port can also move the port plate vertically to either an upper or lower position. In the retracted, lower position, port plate 119 allows motion of the storage shelves 110 because it rests below the shelf plate 120 and above the bearing plate 121. FIG. 7 shows the vertical clearance between the port plate and storage shelf when the port plate is retracted and in the lower position. This vertical clearance is shown by dashed lines, which define a C-shaped space 120a. FIG. 1 shows the clearance between the retracted port plate and the storage shelf when the storage shelf is at one of its stop positions. This clearance allows the port plate to move vertically at the stop position to either pick up a FOUP from a storage shelf or place a FOUP on a storage shelf.

Figure 19A:
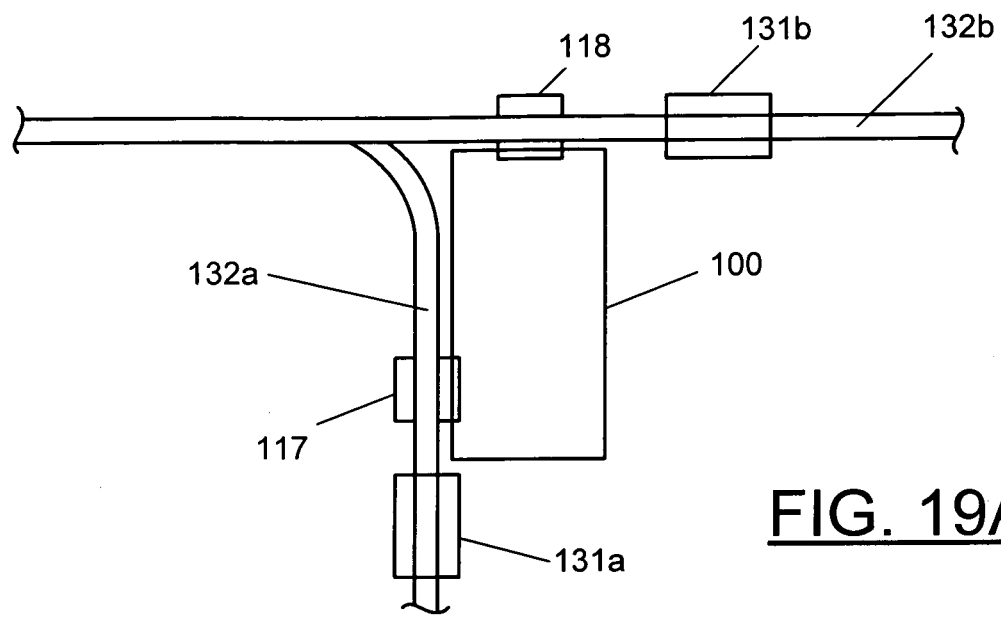
FIGS. 19a and 19b are plan views of the present invention showing different configurations of active ports and OHT.
Figure 19B:
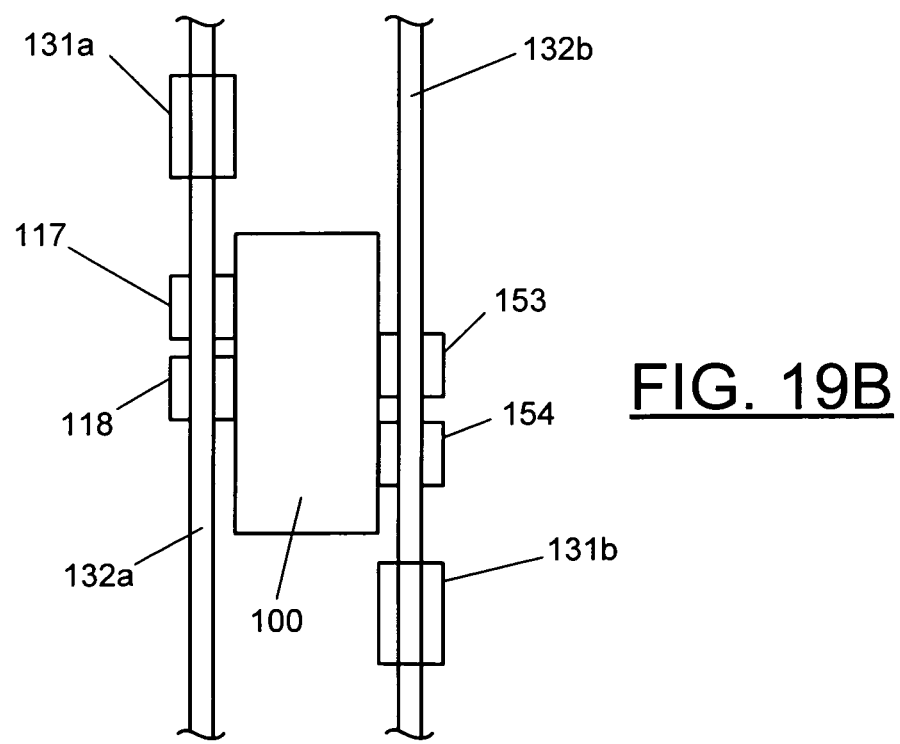

FIG. 1 shows two active ports, however, any number could be used depending on the size of the storage system and the configuration of the AMHS. The active ports can also be located on any side of the storage system. FIGS. 19a and 19b show plan views of different configurations of active ports and OHT. FIG. 19a shows storage system 100 with active ports 117 and 118. Active port 118, at the end of the storage system, is aligned with OHT rail 132b which supports OHT vehicle 131b, while active port 117, at the side of the storage system, is aligned with OHT rail 132a, which supports OHT vehicle 131a. FIG. 19b shows storage system 100 with active ports 117, 118, 153, and 154. In FIG. 19b active ports 117 and 118 are aligned with OHT rail 132a and OHT vehicle 131a, while active ports 153 and 154 are on the opposite side of the storage system, aligned with OHT rail 132b and OHT vehicle 131b.

FIGS. 1 and 7 show pins (e.g., features) used to register and retain the position of the FOUP. Shelf pins 122 engage mating features (e.g., a slot) on the bottom of the FOUP to accurately position and support the FOUP while it is resting on the shelf plate. Port pins 123 engage the same mating features (e.g., slot) on the bottom of the FOUP to accurately position and support the FOUP while it is resting on the port plate. The slot allows both pins 122 and 123 to engage the bottom of the container base. However, as shown, the pins 122 and 123, at each of the three locations, are positioned proximate to one another (see FIG. 1, storage shelf 120 and port plate 119 of 110b). At a stop position, a FOUP at an active port can have its support transferred from the shelf pins to the port pins by raising the port plate to the upper position.

While FOUPs are designed to have features on their bottom plate for pin engagement, other features can be used to accurately hold a container on a shelf plate or port plate. For example, raised features on the port plate or shelf plate could constrain the outer edge of the bottom of the container or mate with relieved areas on the bottom surface of the container. Thus, it should be understood that other holding features other than pins can be used. The holding features can connect, grab, grasp, couple, mate, balance, or engage the container. Also, the container does not have to be a FOUP, and the container can be any open, closed, partially closed/open, and can also hold any size or type of substrate. The port features and the plate features, as claimed, can encompass any type of holding feature, including pins. If the port features are pins, then they are referred to herein as port pins, and if the plate features are pins, then they are referred to herein as plate pins.

Figure 8:
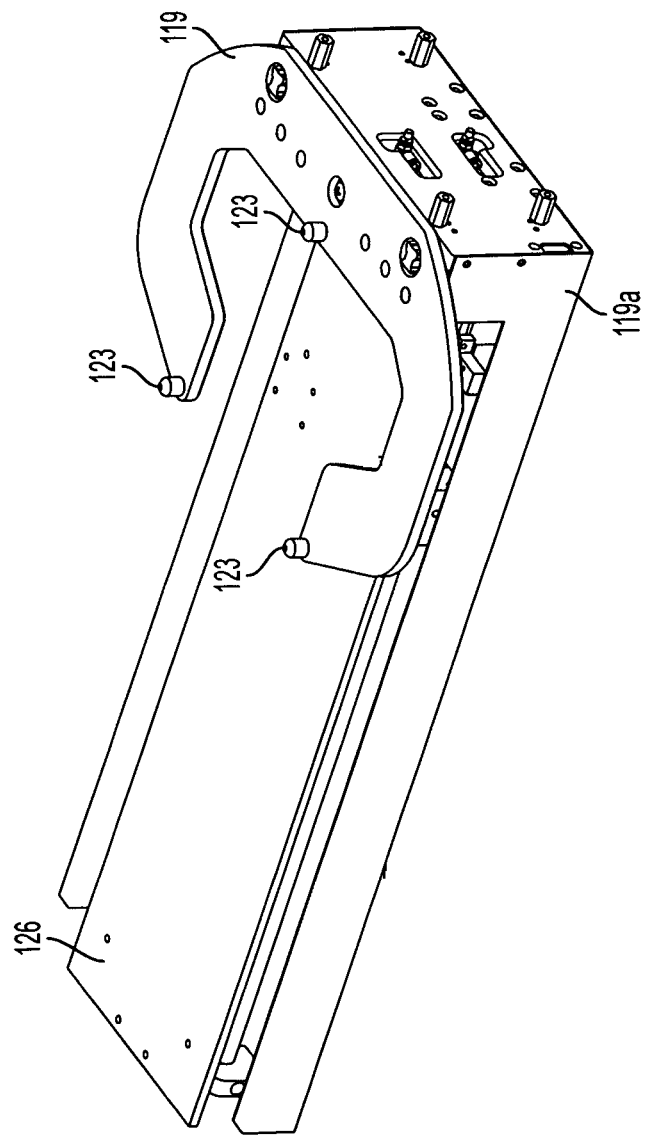
FIGS. 8, 9, 10, and 11 show different positions of the active port mechanism.
Figure 9:
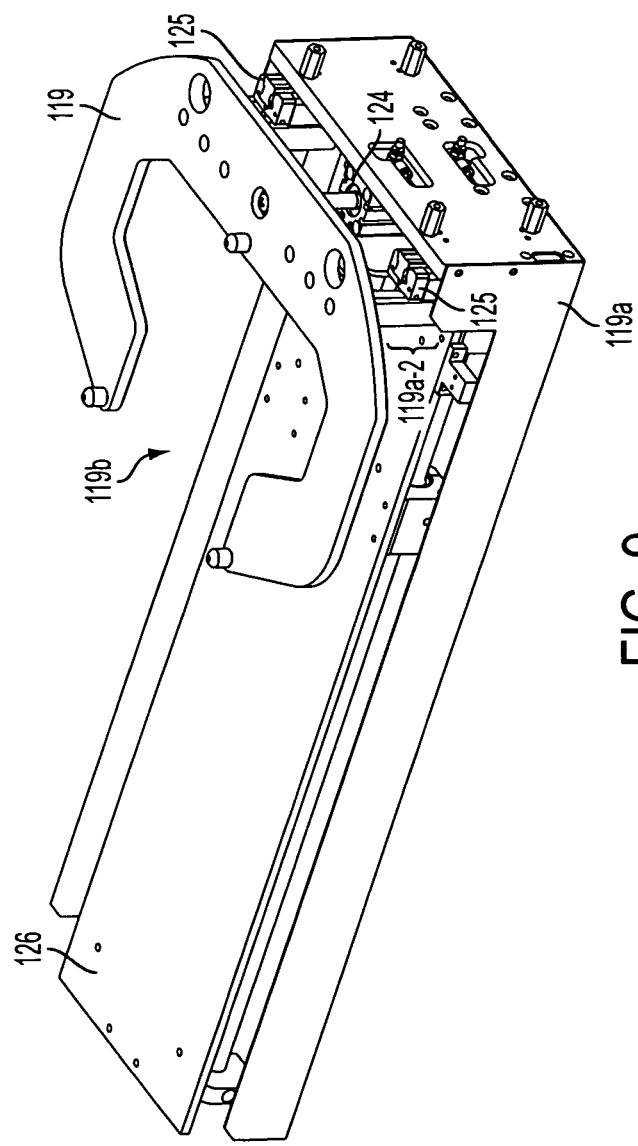
Figure 10:
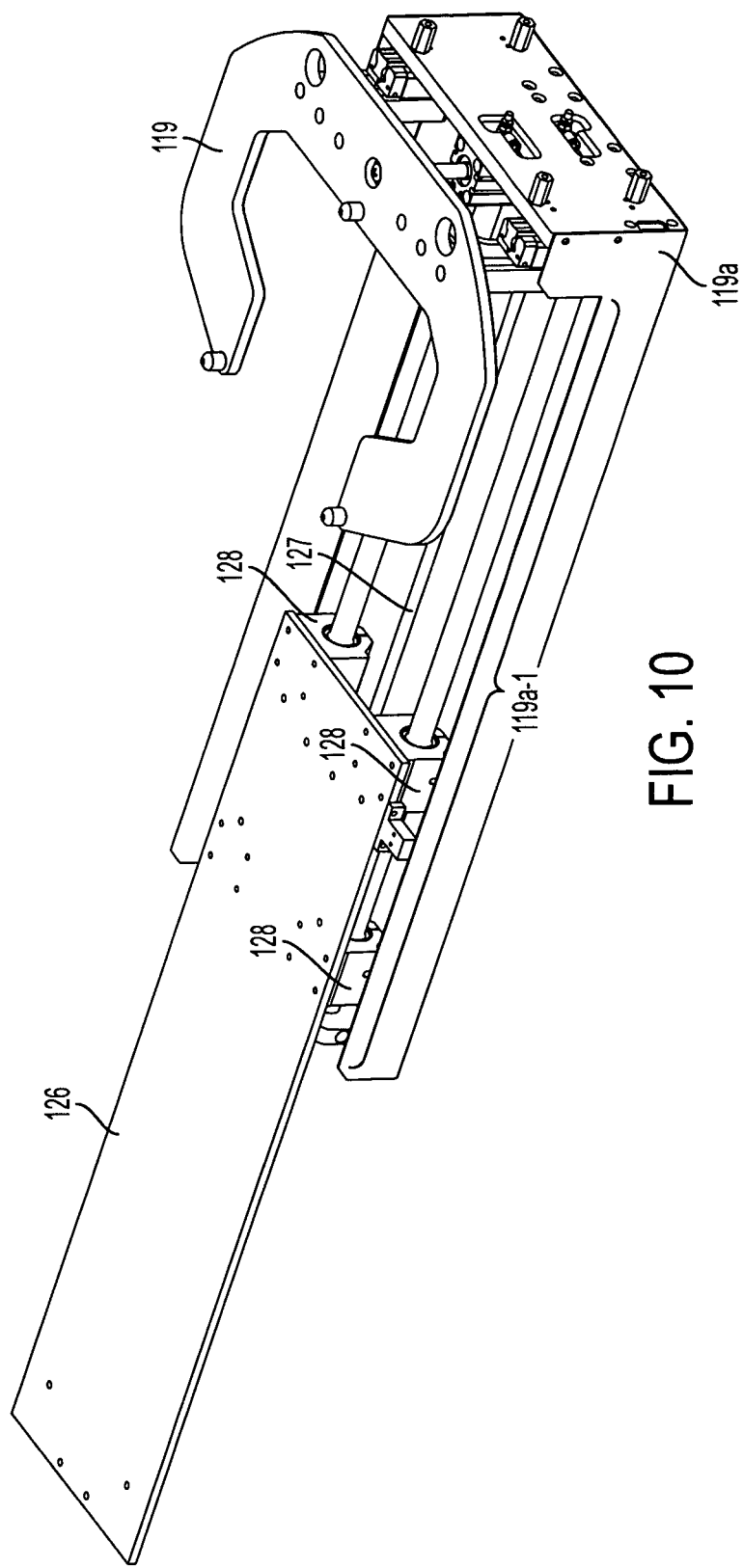
Figure 11:
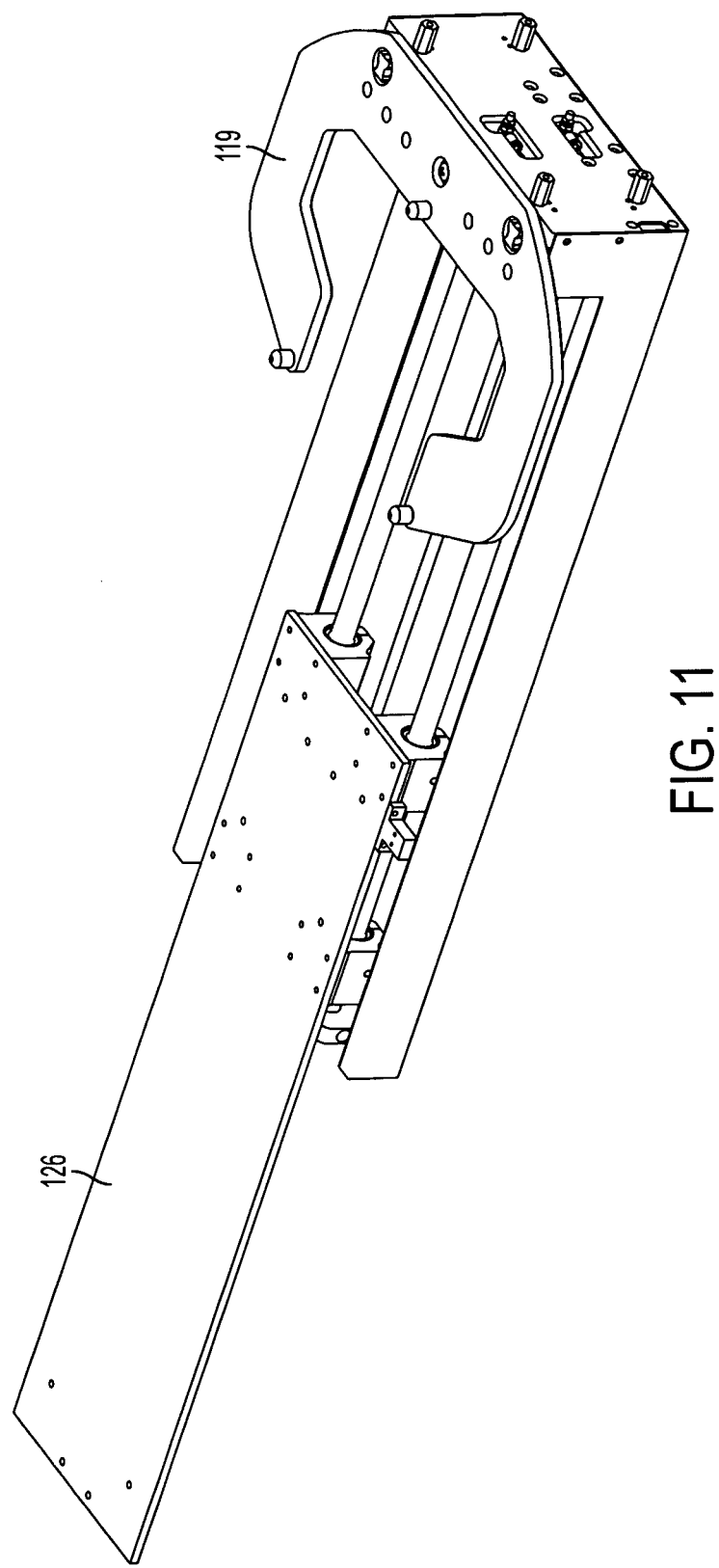

FIGS. 8, 9, 10, and 11 show four positions of the port plate 119 as moved by the active port assembly 119a. The active port assembly 119a is shown detached from the base plate for clarity. In FIG. 8 the port plate 119 is retracted (retracted position) and at the lower position. In FIG. 9 the port plate 119 has been raised to the upper position by a vertical motion assembly 119a-2, as it would be to pick a FOUP off of a storage shelf. The vertical motion can be accomplished in many ways. By way of example, the vertical motion can be by actuation of vertical pneumatic cylinder 124 and is guided by vertical linear bearings 125. When installed in the storage system, active port base 126 is attached to base plate 129. Also shown, the port plate 119 has an opening 119b, which is sufficient to fit around the storage shelf. In one embodiment, this opening defines an space on one side, where the port plate pins can still be located at ends of the opening and at an opposite side of the opening. In FIG. 10 the port plate 119, which is in the upper position, has been moved horizontally to the extended position using a horizontal motion assembly 119a-1. By way of example, the horizontal motion assembly 119a-1 can include actuation of a horizontal pneumatic cylinder 127 and is guided by horizontal linear bearings 128. In FIG. 10 the body of horizontal pneumatic cylinder is under active port base 126 and can not be seen, with only the cylinder's actuator rod visible. In FIG. 11 the port plate 119 has moved to its lower position, where it is now ready to move to the retracted position without concern for collision with moving shelves or FOUPs.

The vertical and horizontal linear motion of the active port are accomplished in this embodiment using pneumatic cylinders, however, other drive means known in the art could alternatively be used, such as a ball screw or a leadscrew driven by an electric motor. Another alternative drive means would be a rack gear driven by an electric motor with a spur gear.

Operation of the active ports 117 and 118 would be coordinated with the operation of motor 113. In this embodiment the active ports are controlled by the same control circuits used to control the operation of motor 113, however, there are many different configurations for the control circuits. One alternative example would be to have the active ports controlled by one or more microprocessor based controllers, and these would communicate through parallel or serial signals with the motor control circuits to coordinate functions.

Figure 4:
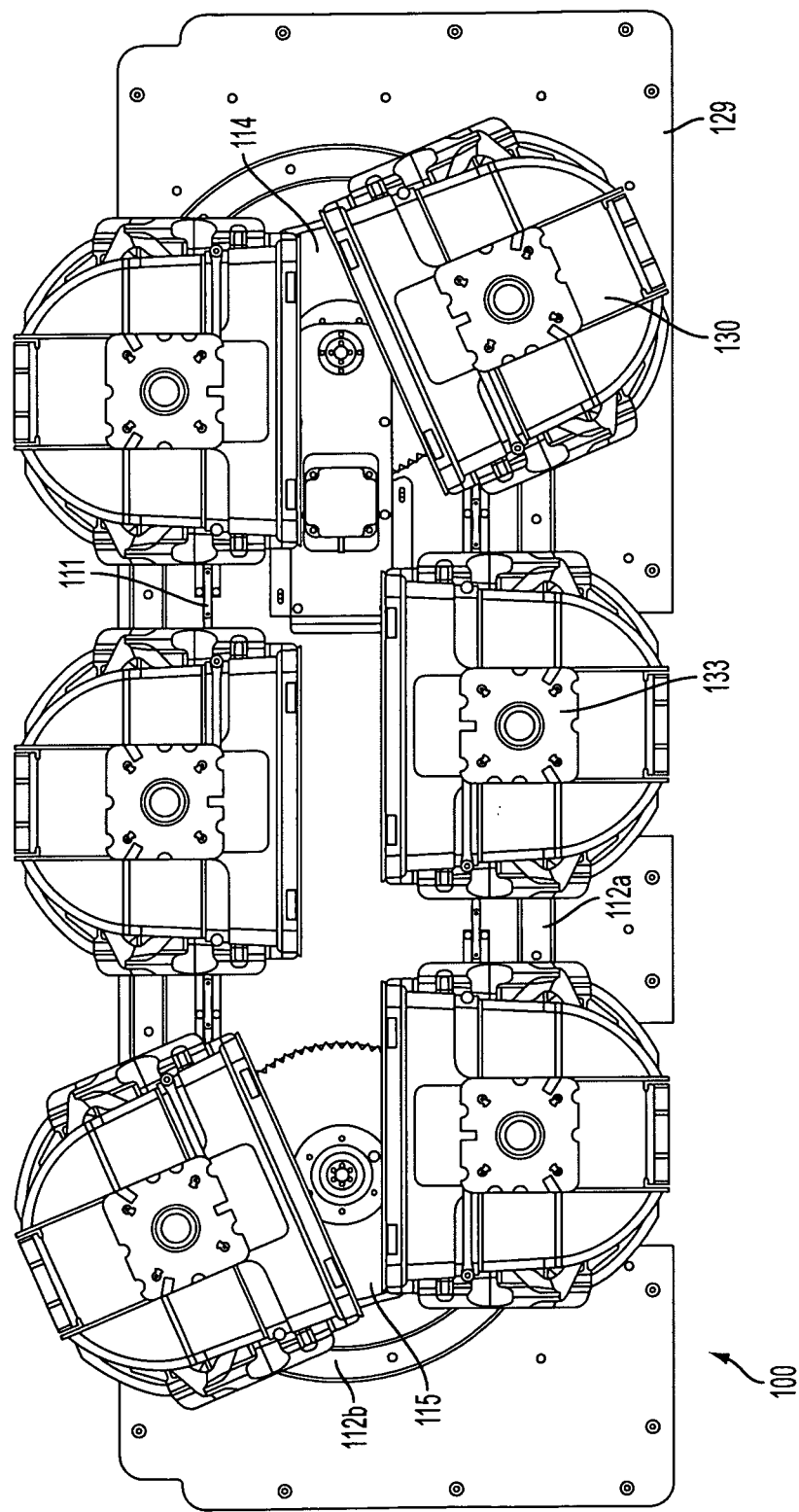
FIG. 4 is a plan view of the present invention without active ports.
Figure 5:
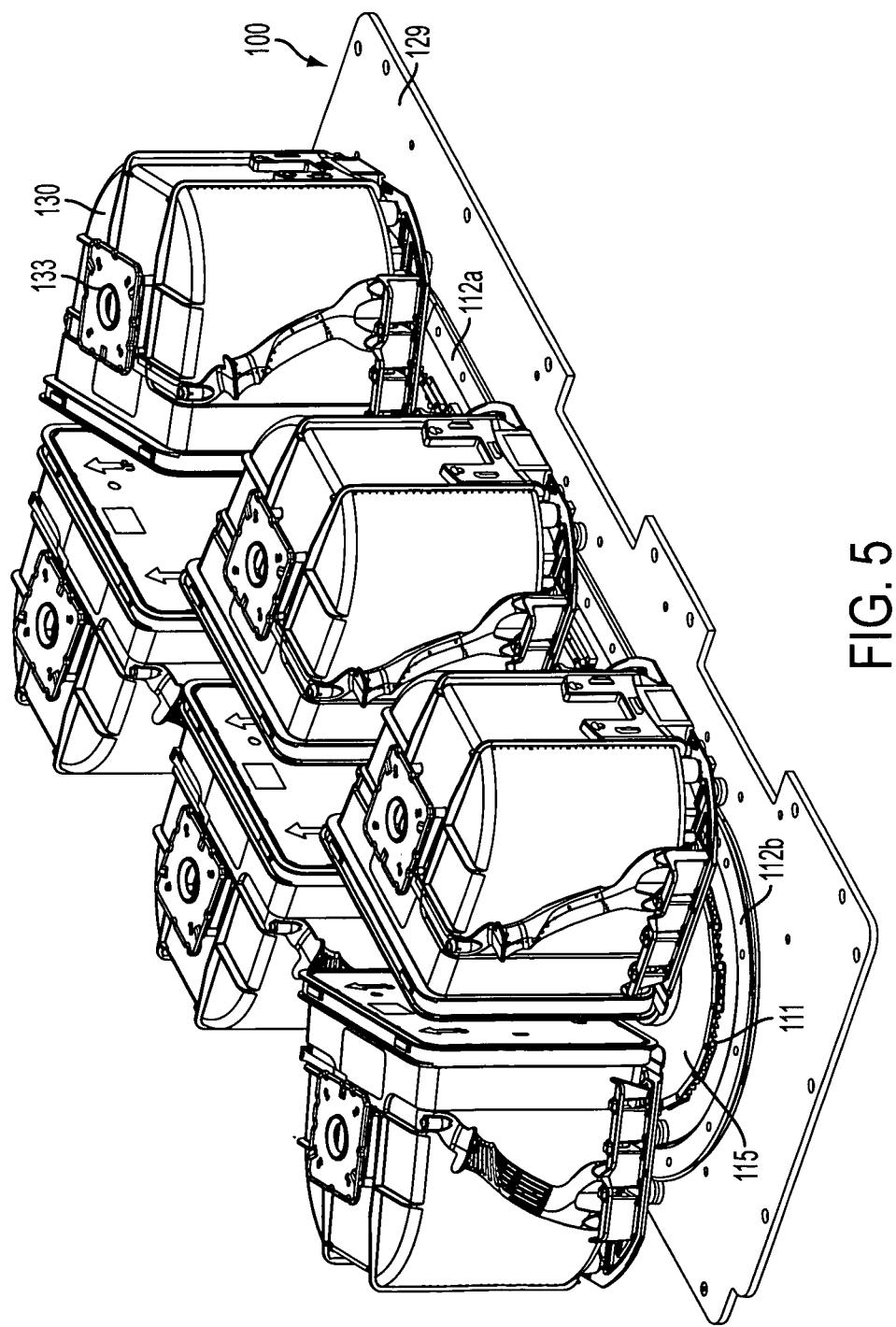
FIG. 5 is another view of the present invention without active ports.

FIGS. 4 and 5 show the storage system with a FOUP 130 loaded on each of the storage shelves. The spacing of the shelves is such that as the shelves and FOUPs are moved around the storage system 100, they do not collide as they turn the corner. Six storage shelves are shown in these figures, however, more storage shelves, and FOUPs, could be accommodated by extending the length of the system. The most efficient use of space would be to leave the curved rail sections 112b unchanged, and extend the length of the straight rail sections 112a, along with the base plate 129 and drive chain 111, however, the length of drive chain for attaching shelves could also be increased by increasing the radius of the curved rail section 112b at each end along with the diameter of the sprockets 114 and 115. Either method, or a combination of both, would increase the length of the drive chain, allowing more shelves to be attached at their minimum spacing.

Figure 6:
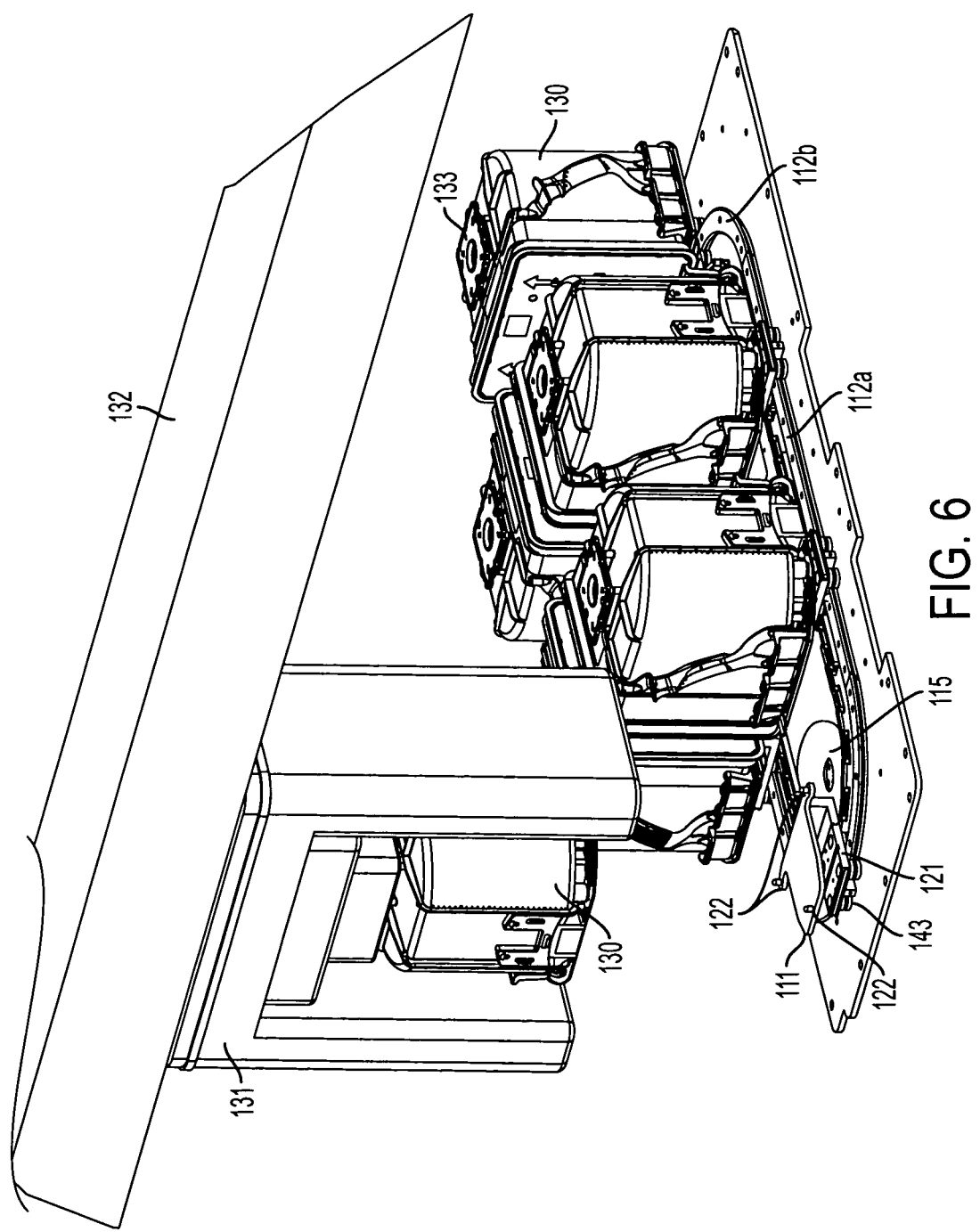
FIG. 6 is a view of the present invention being loaded by an Overhead Transport ("OHT") type of AMHS.

FIG. 6 shows an OHT vehicle 131 with a FOUP 130 aligned over an empty shelf 110a of the storage system, which is located at an elevation above the tools in the fab. An OHT vehicle can move a FOUP between stockers, storage systems and tools using the OHT rail 132 to support it. The OHT vehicle grips the FOUP by the FOUP top handle 133 using a gripper mechanism and travels about the fab at an elevation above the tools. The FOUP is lowered or raised at the stockers, storage systems or tools by using a hoist. The other five storage shelves 110b-110f have FOUPs stored on them, and 110a is empty. OHT vehicle 131 moves along OHT rail 132 and stops at a position which is aligned with the stopped shelf 110a.

In this position it can lower the FOUP on to shelf 110a. After the FOUP is lowered on to shelf 110a, it can retract its hoist and move to another destination or it can pick up another FOUP from the storage system. To pick up another FOUP, the OHT would wait until the desired FOUP has been moved to the aligned position under the OHT vehicle, lower its gripper with its hoist, grip the FOUP top handle, raise the FOUP, then proceed to its next destination. The positioning of a new FOUP for pick up is very fast because it only requires the operation of a single motor. The storage system control circuits could drive the motor in either direction to move the FOUP to the aligned position under the OHT, and for minimum delay, it could choose the direction that resulted in the minimum travel distance.

Figure 12:
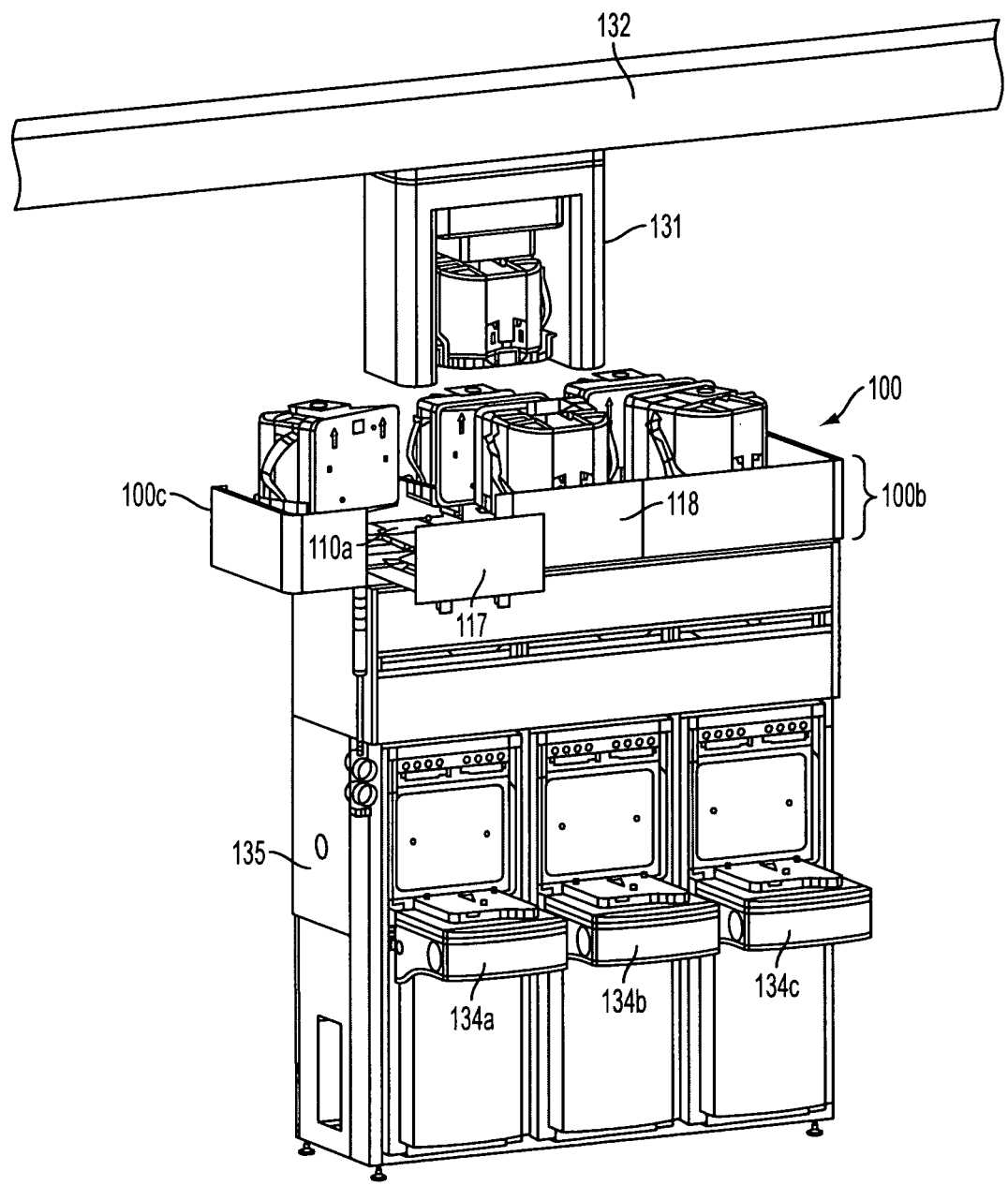
FIG. 12 is a view of the present invention including active ports.
Figure 13:
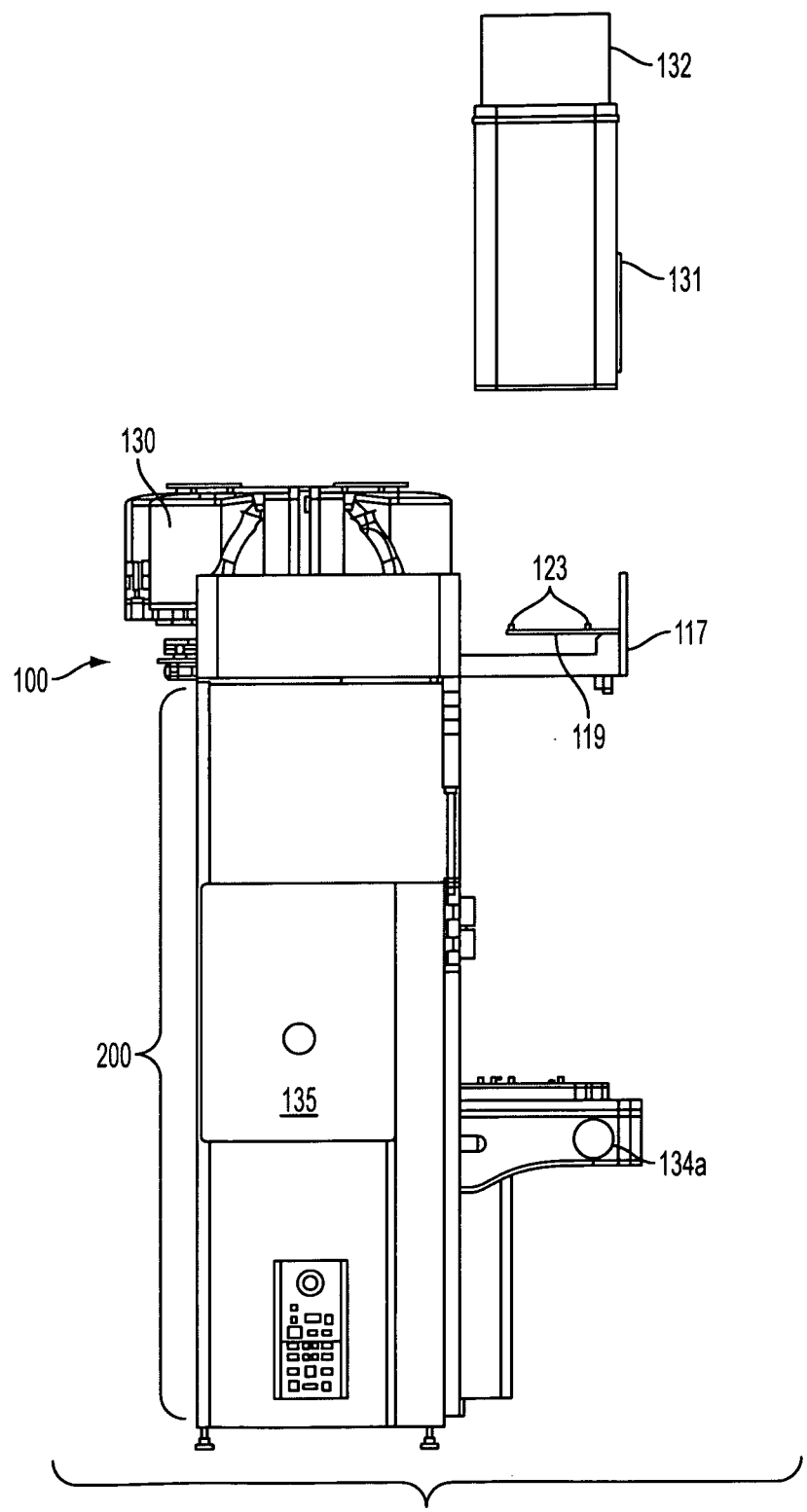
FIG. 13 is a side view of the present invention including active ports.

FIGS. 12 and 13 show the present invention mounted above a tool 135 to provide local storage for the FOUPs that are scheduled to be processed by the tool. The storage system assembly 100b of the storage system 100 is shown to include a frame 100c. The frame 100c may have a structural component and non-structural components, so long as the frame 100c can be attached to a surface of an assembly 200 of the tool (see FIG. 13). The assembly 200 can include parts of the tool only or can also include add-on components, panels, electronics, screens, frames, ducts, vents, filters, tracks, pneumatics, circuits, facility connections, frame stabilizers, electrical connectors, communications connectors, and the like. Thus, placing the storage system assembly 100b over the tool can include placing or connecting the storage system assembly 100b to parts of the tool or components connected to the tool. Also shown, in FIG. 13 is that, in one example, the OHT 131 is aligned over the active port plate 119, as well as the tool shelf of tool load ports 134a. The tool shelf can be a drop or pickup point for the OHT and so can the active port plate 119, as they are aligned in a zone (e.g., container load zone) that is configured to receive or supply containers.

OHT vehicle 131 moves along OHT rail 132 until aligned with active port 117, active port 118, or any of the tool loadports 134a, 134b, or 134c. OHT vehicle 131 is in position to load a FOUP on to empty active port 117, which could then retract and lower it on to empty storage shelf 110a, however, other FOUP transfers are possible. For example, with all active ports retracted, the OHT vehicle could transfer its FOUP to one of the loadports 134a, 134b, or 134c.

Another example would have the OHT vehicle arrive at the position of active port 117 while not carrying a FOUP. Active port 117 could pick up a FOUP from a storage shelf and move to the extended position, where it could then be grabbed by the OHT gripper and lifted to the OHT vehicle. After active port 117 retracted, the OHT vehicle could then lower the FOUP to one of the loadports 134a, 134b, or 134c.

The storage system could also be used to store empty FOUPs while the wafers originally from the FOUPs are being processed. This allows a larger batch of wafers to be processed at the same time with a limited number of tool loadports. In this case, with active ports retracted, the OHT would pick up the empty FOUP from one of the loadports, such as loadport 134a, lift the empty FOUP to the OHT vehicle, extend an active port, such as active port 117, then lower the empty FOUP on to the active port, after which the active port could retract and lower the empty FOUP on to an empty shelf that was aligned with the active port.

In FIGS. 12 and 13 the storage system with active ports is installed above a tool, however, it is not necessary for it to be above a tool. An OHT vehicle could access the FOUPs stored in the storage system, using the active ports, if the storage system was located anywhere along the path of the OHT, the only requirement being that the OHT vehicle hoist could be aligned with the active port when it is extended.

Figure 14:
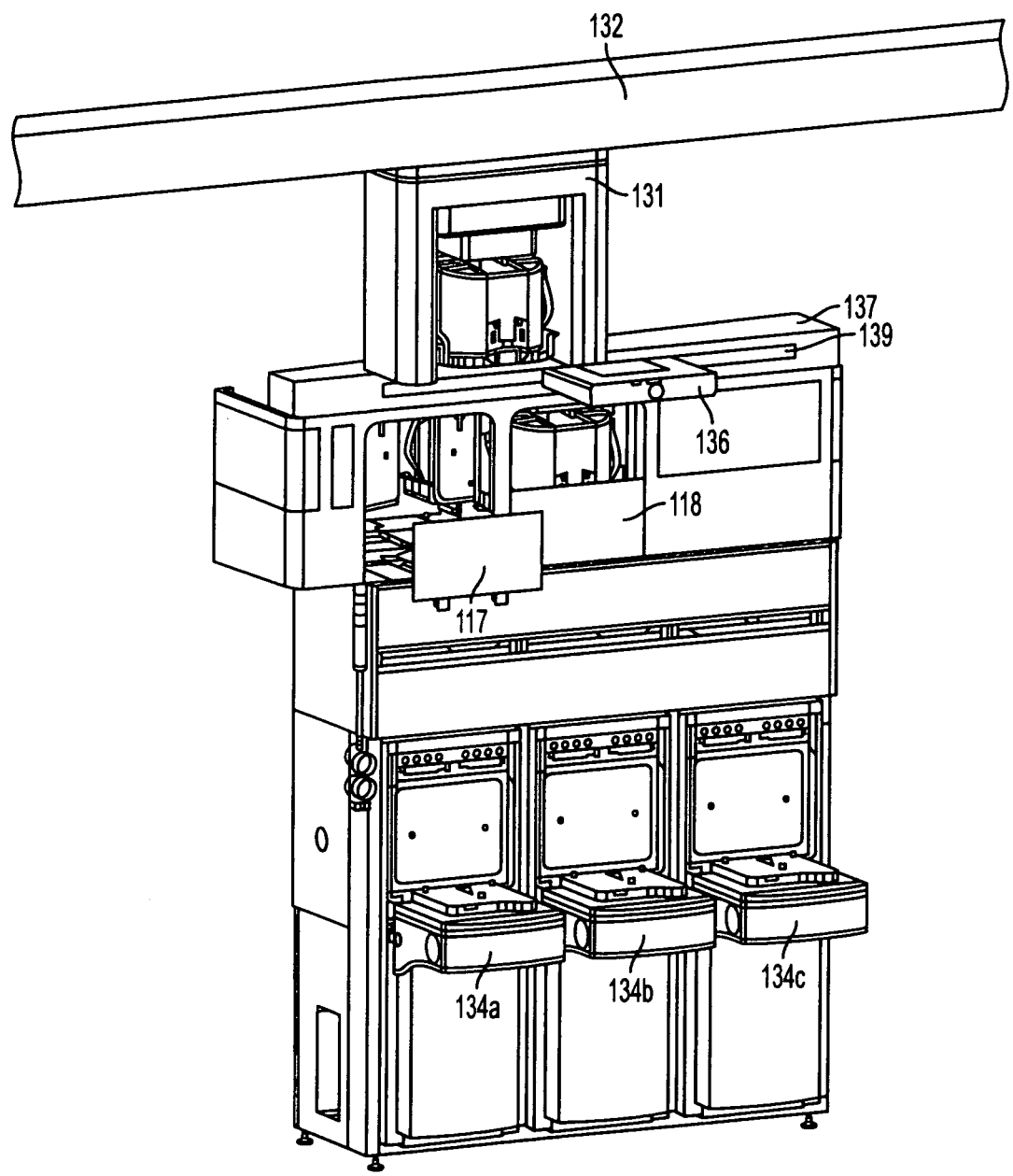
FIG. 14 is a view of the present invention including a transfer hoist and active ports.
Figure 15:
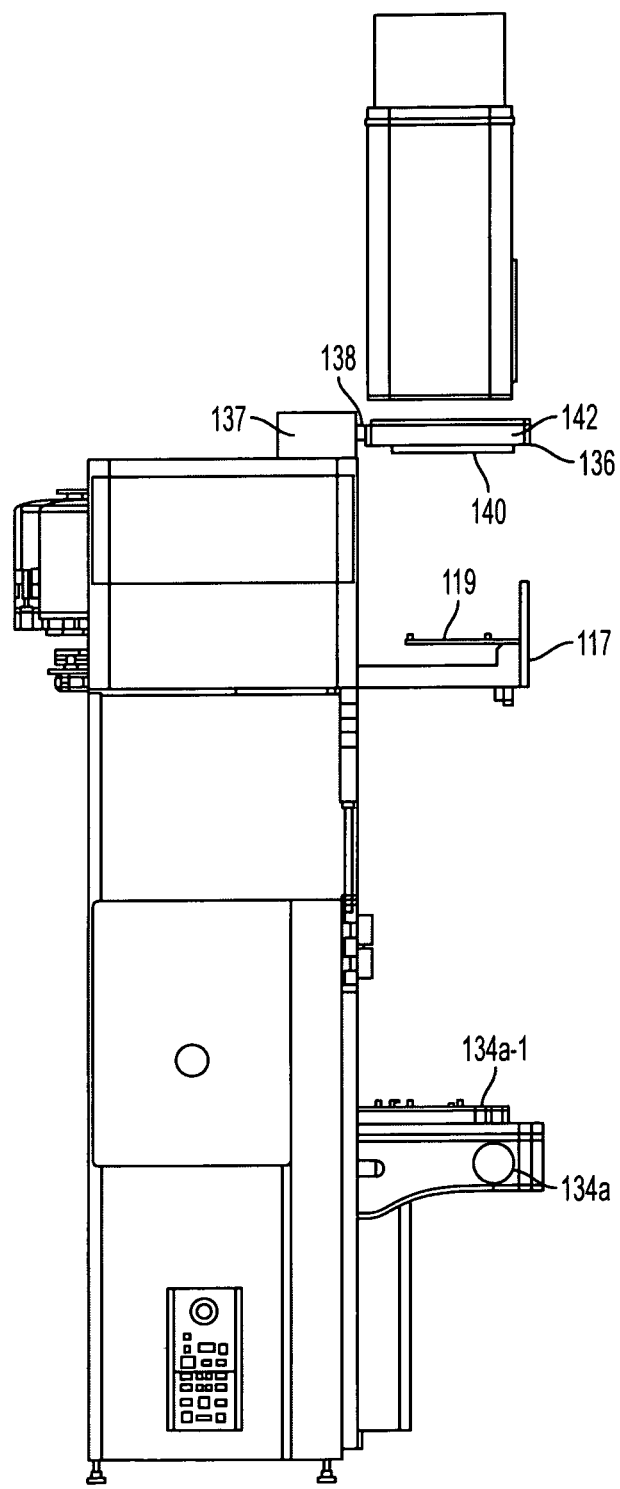
FIG. 15 is a side view of the present invention including a transfer hoist and active ports.

FIGS. 14 and 15 show an embodiment of the present invention where a hoist can transfer FOUPs between the storage system and the tool without the aid of an OHT vehicle. The transfer hoist 136 is shown with transfer hoist gripper 140 retracted into transfer hoist frame 142. The transfer hoist 136 can also align over an active port plate 119 or over one or more of the load port shelves. In this embodiment, the transfer hoist extends into the same zone (e.g., container load zone) that the active port does when extended and the same zone where the shelf of the load port(s) is located. This allows for efficient transfer using the transfer hoist 136. An example of having the transfer hoist 136, active port plate 119, and load port shelf 134a-1 aligned is shown in FIG. 15.

By way of example, transfer hoist 136 can move laterally along hoist linear drive 137. The extent of lateral travel includes positions aligned above active ports 117 and 118, and loadports 134a, 134b, and 134c. The linear drive means in the hoist linear drive 137 could be any of the methods known in the art. For example, the linear drive means could be a rack gear and electric motor with spur gear, or a horizontal ball screw and ball nut driven by an electric motor. The cantilever support 138 would be guided by one or more linear bearings and connected to the movable part of the linear drive means. The linear bearings and cantilever support must be rigid enough to keep the transfer hoist 136 in a reasonably horizontal plane with the added load of a full FOUP. A flexible cable assembly in the hoist linear drive would allow power and communication wiring to be connected between the storage system and its control circuits and the control circuits of the transfer hoist.

The OHT vehicle 131 can transfer FOUPs to and from both active ports and all loadports, but it is not necessary for the OHT to transfer FOUPs to and from the loadports. The transfer hoist can transfer FOUPs from the storage system to the loadports on request from the tool without waiting for the arrival of an OHT vehicle. The OHT can deliver FOUPs to the storage system to maintain an inventory of FOUPs to be processed by the tool without regard for the status of the tool loadports. The OHT can pick up processed FOUPs from either the tool loadport or the storage system. In one case the processed FOUP could wait on the loadport until an OHT was available to remove it, if that loadport was not needed to start processing on a new FOUP. In the other case, where the loadport with the processed FOUP was needed to start processing on a new FOUP, the processed FOUP could be moved with the transfer hoist to an active port, which would load it on to an empty storage shelf, then a new FOUP would be moved from storage shelf to active port to transfer hoist to the recently vacated loadport.

Figure 16:
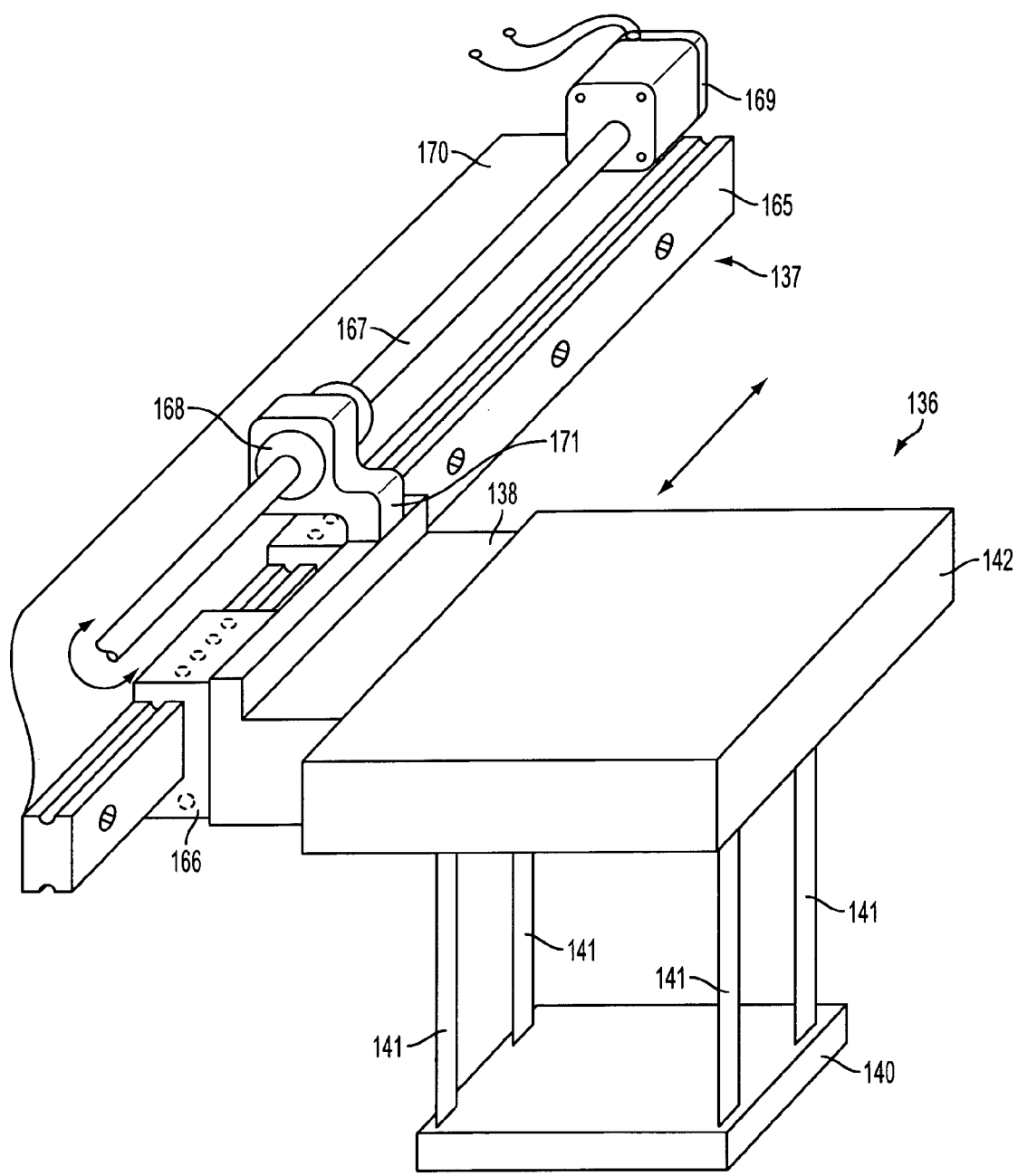
FIG. 16 is a view of a transfer hoist of the present invention.
Figure 17:
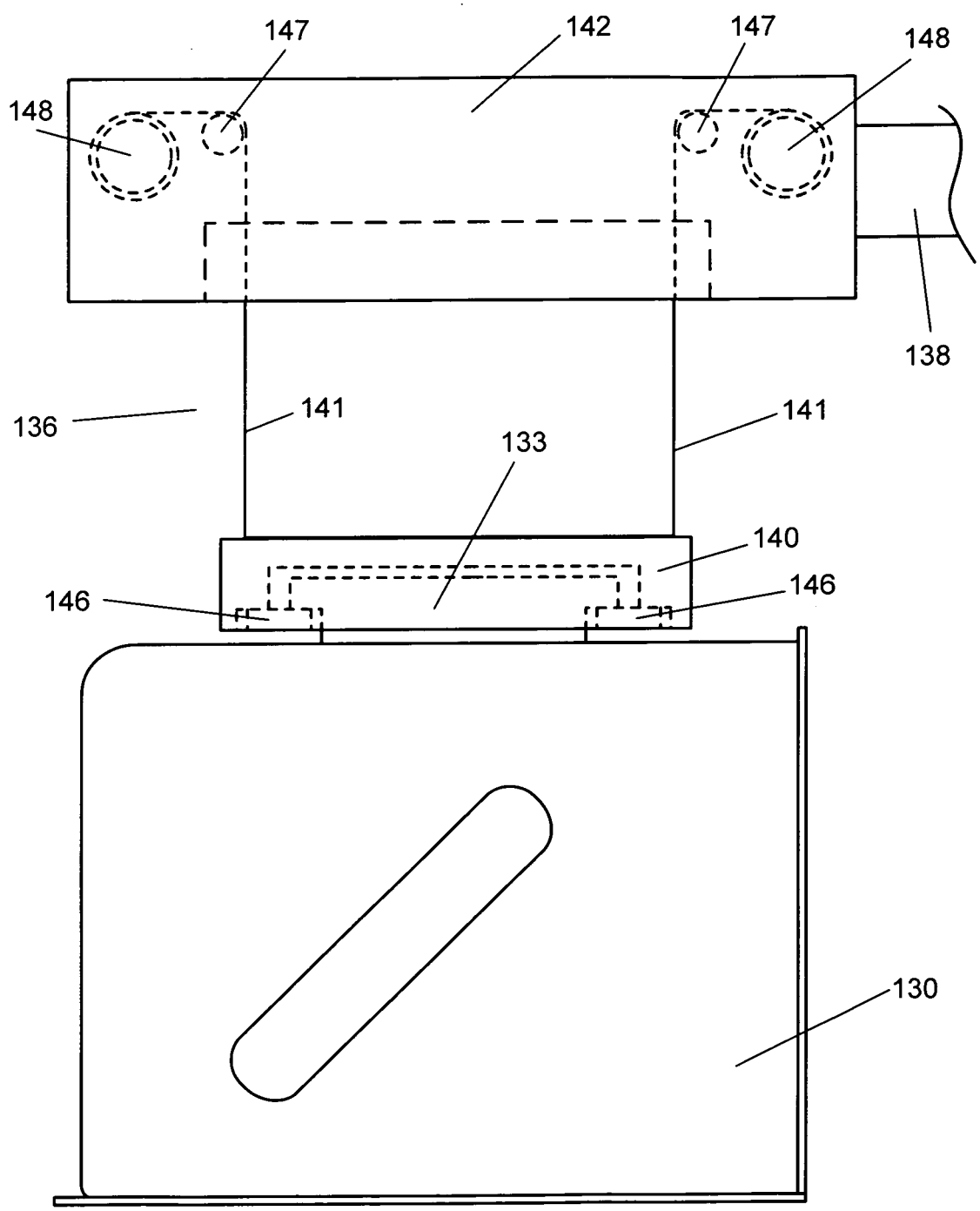
FIG. 17 is another view of the transfer hoist of the present invention.

FIGS. 16 and 17 provide design details for the transport hoist 136. In general, the transport hoist has many of the same features as the hoist mechanism on an OHT; retracting belts that move a FOUP gripper mechanism between a lower elevation and a higher elevation. Hoist frame 142 contains electric motors that rotate belt drive pulleys 147, retracting transfer hoist belts 141 into hoist frame 142. The retracted belt is rolled on to belt wrap pulleys 148 which provide a continuous wrap torque. Transfer hoist belts 141 are connected to transfer hoist gripper 140, therefore retraction of the transfer hoist belts into the transfer hoist frame results in vertical motion of the transfer hoist gripper. Transfer hoist gripper 140 envelops the periphery of FOUP top handle 133 and then gripper latch 146 is activated, positioning the gripper latch under the bottom edge of the FOUP top handle. With the support of the gripper latch, the FOUP can then be lifted from the support surface it has been resting on. Power and communication between the transfer hoist frame and the transfer hoist gripper is provided by wires that are embedded in the transfer hoist belt. Alternatively, the gripper could be battery powered, and battery recharging would be accomplished through electrical contacts when the gripper is raised to the transfer hoist frame. In the case of the battery powered gripper, communications would be wireless, either through radio frequency transmission, or through light beam transmission (visible or infrared).

FIG. 16 shows additional details of the hoist linear drive assembly 137. Plate 170 provides support for horizontal drive motor 169 and hoist linear rail 165. Linear rail bearings 166 attach to cantilever support 138 along with ball nut mount 171. Ball screw 167 attaches to the shaft of the drive motor and passes through ball nut 168 which is held by the ball nut mount. As the drive motor shaft is rotated, the ball nut and ball nut mount push the cantilever support and hoist laterally as it slides on the rail 165 and bearings 166. For clarity, cables that supply power and control signals to the hoist are not shown.

Alternative components could be used in the hoist linear drive assembly. For example, the rotary type motor 169 could be replaced with a linear motor having permanent magnets mounted on plate 170 and a winding assembly attached to the sliding cantilever support block. Alternatively, a leadscrew and nut could replace the ball screw and ball nut, or the linear bearing could be replaced by a pair of parallel guide shafts and tubular bearings.

Figure 2:
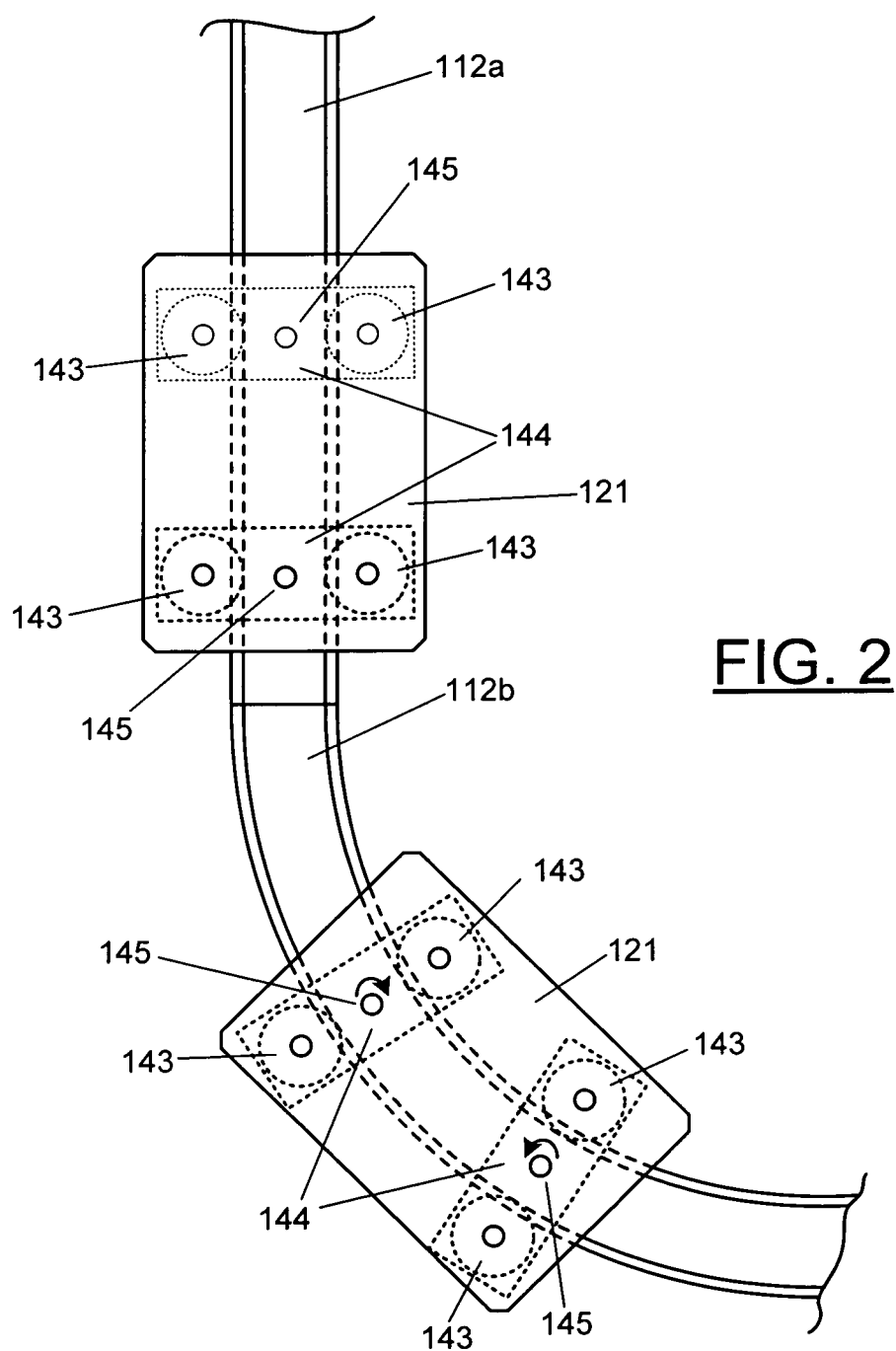
FIG. 2 is a plan view of the curved guide rail and bearing truck.
Figure 3:
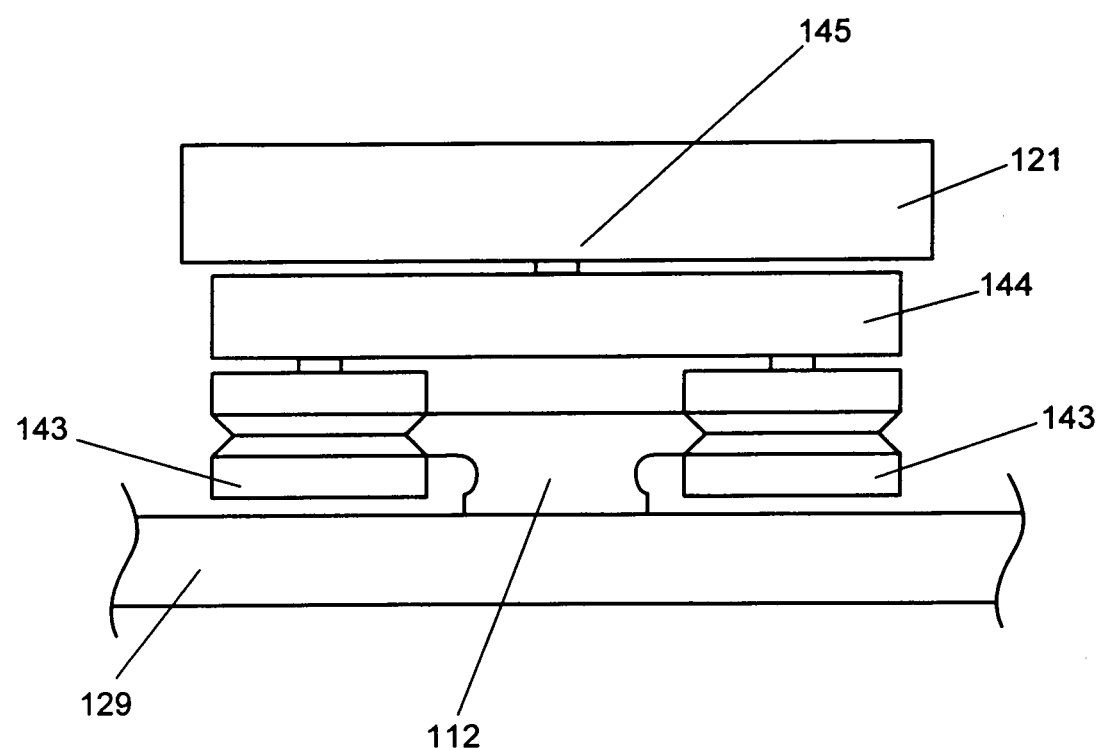
FIG. 3 is a side view of the rail and bearing truck.

FIGS. 2 and 3 show details of the bearing assembly that guides and supports the storage shelves. Several companies, such as THK Co., LTD and Bishop—Wisecarver Corporation provide bearing/rail systems that can be used to support motion around a combination of straight and curved rail or track. THK Co. provides a product called "Straight—Curved Guide HMG", and Bishop—Wisecarver provides their "PRT Track System" with curved and straight sections. Several methods are known in the art for moving between curved and straight rail sections, and the drawings in FIGS. 2 and 3 are but one example. A bearing plate 121 would support a storage shelf. Each bearing plate would be connected by a pin and a roller plate bearing 145 to each of two roller plates 144. The roller plates 144 can freely pivot about roller plate bearing 145 and each mount 2 rollers, each of which can rotate on a bearing. The rollers are spaced such that they provide a lateral force that grabs the rail from each side. As the bearing truck moves around the curved rail the roller plate can pivot to allow unhindered motion. The rail can take on several structural configurations, so long as a track is provided for completing a loop.

Figure 18:
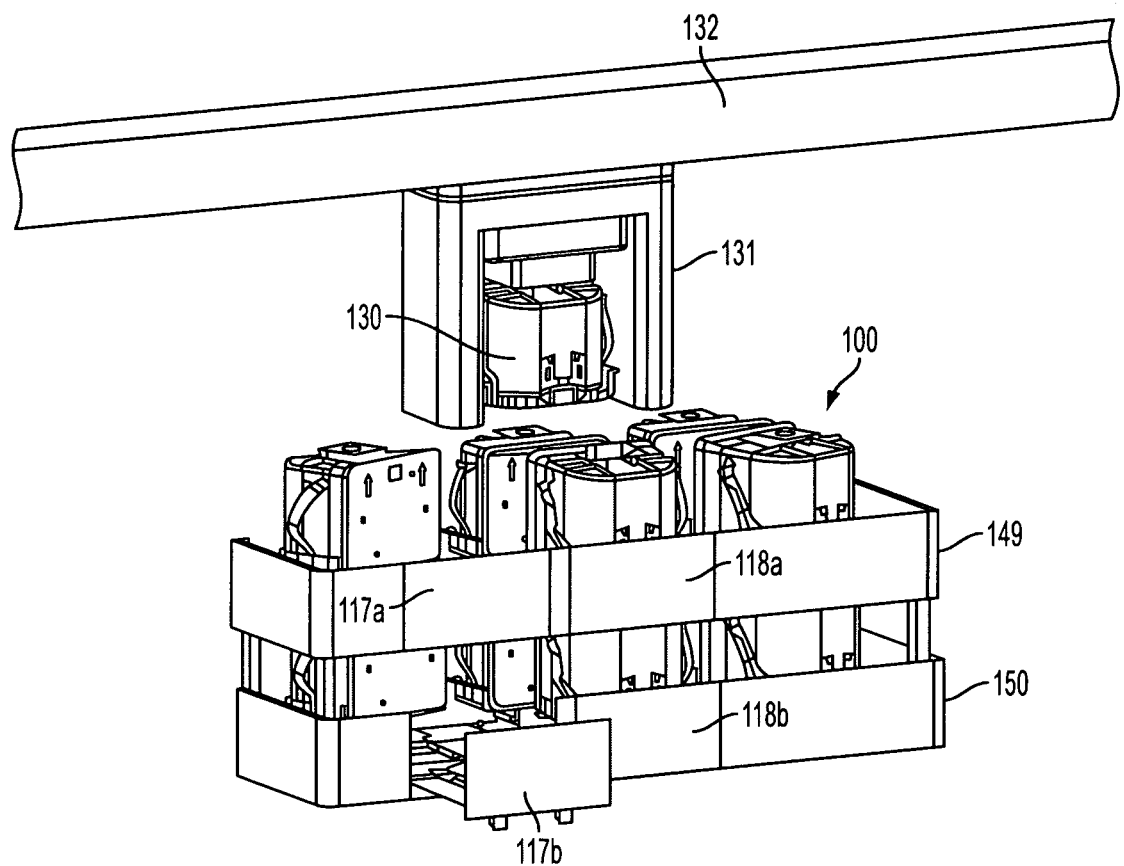
FIG. 18 is another view of the present invention with multiple storage levels.

FIG. 18 shows a storage system with two levels of storage loops that are vertically stacked. Upper level storage 149 has active ports 117a and 118a. Lower level storage 150 has active ports 117b and 118b. The figure shows a FOUP 130 ready to be loaded on to active shelf 117b, which is extended. Active port 117a, which is above active port 117b, must be retracted for OHT vehicle 131 to have unobstructed delivery of the FOUP to active port 117b, however active ports 118a or 118b could be extended, for example, with a FOUP ready to be picked up by an OHT vehicle. A multi-level storage system of this type could have more than two levels, with different locations and quantity of storage shelves. FIG. 18 shows the storage system 100 mounted directly below the ceiling mounted OHT, however, the storage system could be at any elevation. The storage system 100 could be supported by a floor-based structure, a ceiling structure, the AMHS structure, or a combination thereof. The storage system could also be supported by the structure of a tool or other fab facility feature.

Figure 20A:
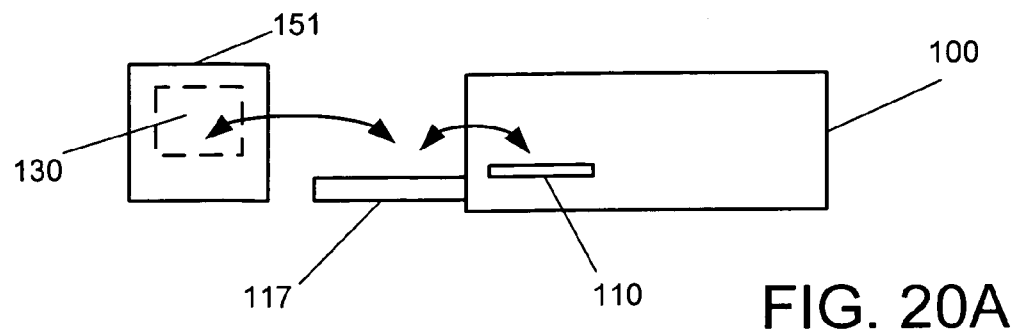
FIGS. 20a, 20b, and 20c are elevation views of different configurations of the present invention with AMHS.
Figure 20B:
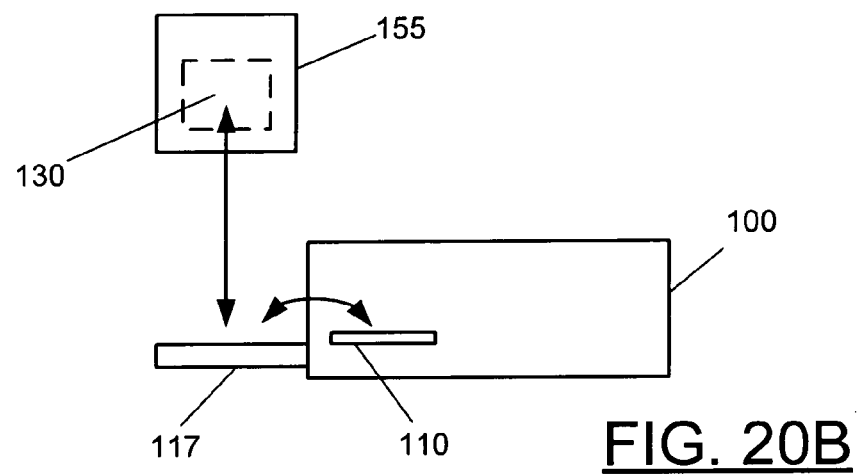
Figure 20C:
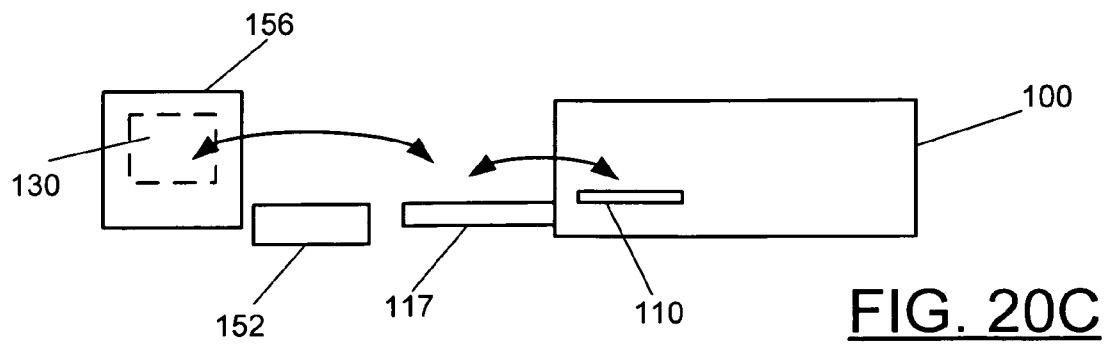

FIGS. 20a, 20b, and 20c are simplified side views of the storage system with an active port that show how it could transfer FOUPs with different basic types of AMHS. The arrows show the path of the FOUP during transfer. FIG. 20a shows an AMHS 151 that is located to the side of the storage system. This type of AMHS has a transfer device built into it that can load the FOUP on to the extended active port 117 which can then retract and transfer the FOUP to a storage shelf 110. FIG. 20b shows an AMHS 155 (such as OHT) that lowers the FOUP on to the active port 117, which then retracts and transfers the FOUP to a storage shelf 110. FIG. 20c shows an AMHS 156 without integral transfer device that is located to the side of a storage system. This AMHS type requires an external transfer device 152 that can pick up the FOUP from the AMHS 156 and move it to active port 117, where it can then be moved to storage shelf 110.

Figure 21A:
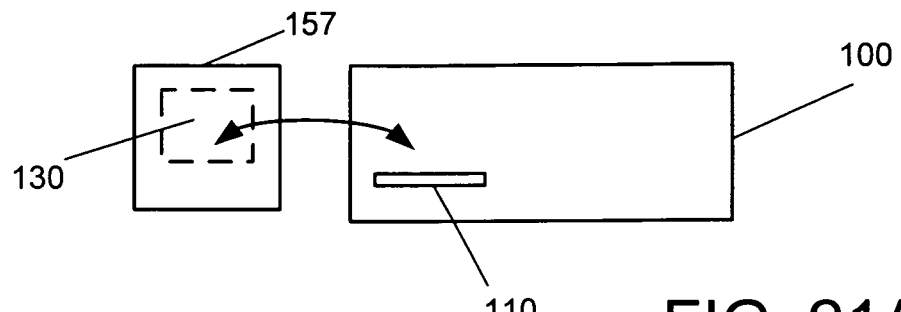
FIGS. 21a, 21b, and 21c are other elevation views of the present invention with AMHS.
Figure 21B:
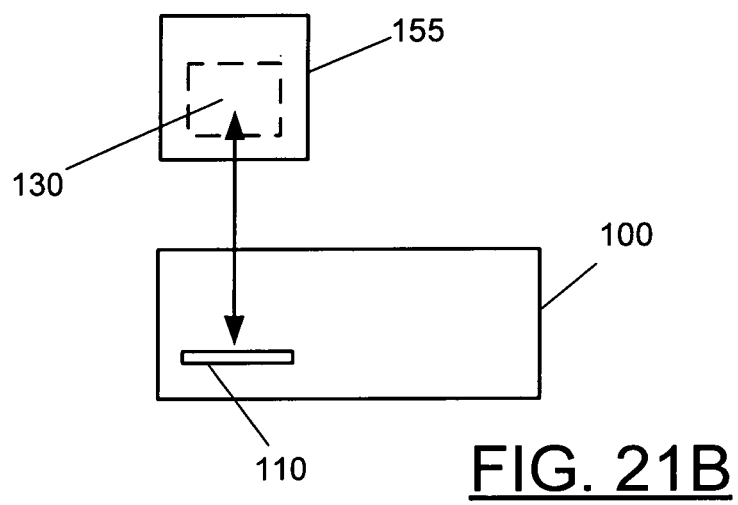
Figure 21C:
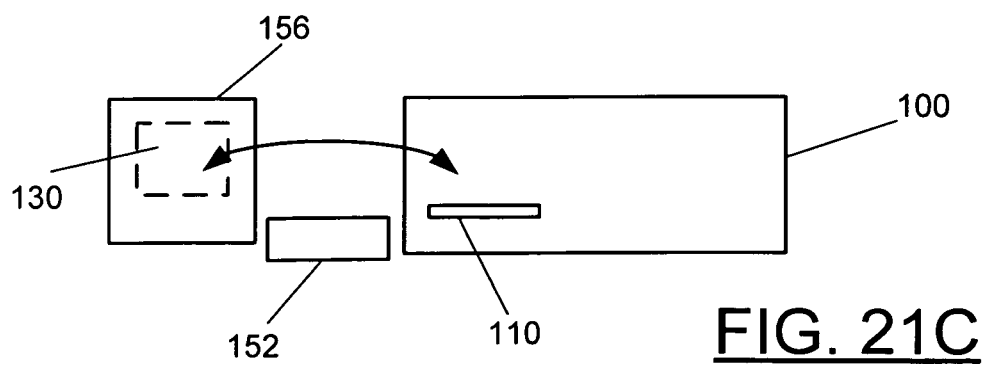

FIGS. 21a, 21b, and 21c are simplified side views of the storage system without active ports that show how it could transfer FOUPs with different basic types of AMHS. The arrows show the path of the FOUP during transfer. FIG. 21a shows an AMHS 151 that is located to the side of the storage system. This type of AMHS has a transfer device built into it that can load the FOUP directly on to storage shelf 110. FIG. 20b shows an AMHS 155 (such as OHT) that lowers the FOUP directly on to storage shelf 110. FIG. 20c shows an AMHS 156 without integral transfer device that is located to the side of a storage system. This AMHS type requires an external transfer device 152 that can pick up the FOUP from the AMHS 156 and move it directly to storage shelf 110.

Figure 22A:
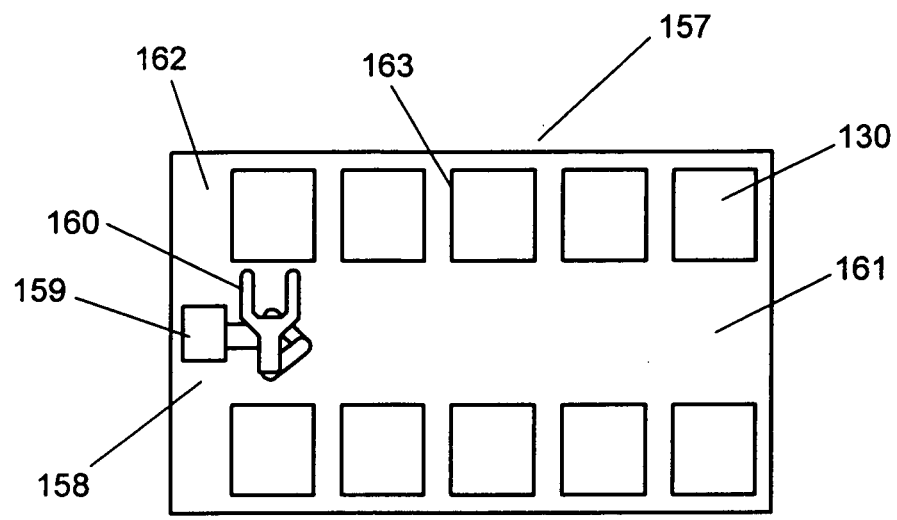
FIGS. 22a and 22b are plan views of the floor space used by a conventional stocker and by a storage system of the present invention.
Figure 22B:
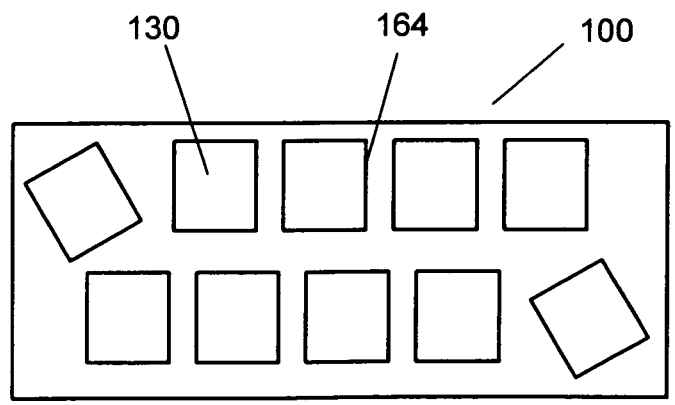

FIGS. 22a and 22b are simplified plan views that show the relative floor space used by a conventional stocker, and by a storage system of the present invention. Each of these figures is showing one level of storage positions, and either the conventional stocker 157 or the storage system 100 could have multiple levels of the shown FOUP arrangement. In FIG. 22a, conventional stocker 157 has ten FOUPS 130 arranged in two rows of five FOUPs. The two rows of FOUPs are separated by stacker robot clearance space 161 that is required to move stacker robot 158 horizontally for access to the stored FOUPs. Stacker robot 158 has vertical column 159 that moves stacker robot arm 160 vertically to align with each level of storage. Stacker robot end space 162 is required for vertical column 159 when accessing the leftmost FOUPs in the storage level. Stacker robot clearance space 161 must be wide enough to accommodate a FOUP plus parts of the robot arm as it is rotated 180 degrees between storage positions on either side of the clearance space 161. In contrast, the storage system 100 of the present design shown in FIG. 22b uses much less floor area for the storage of ten FOUPs 130. Storage system 100 does not require a stacker robot, therefore the clearance spaces 161 and 162 in FIG. 22a are eliminated, resulting in a much denser arrangement.

FIGS. 22a and 22b also show the improved efficiency of motion for the storage system 100 of the present invention. To retrieve a FOUP from storage location 163 in FIG. 22a, the stacker robot 158 must first move horizontally to align with the storage location, then motors in the stacker robot arm 160 extend the arm under the FOUP, then a motor lifts the arm with the FOUP, then the arm motors retract the arm and FOUP, and then the stacker robot can move horizontally to the desired destination port. In FIG. 22b, the storage system 100 of the present invention only has to operate a single motor to move all FOUPs simultaneously until the shelf an FOUP that was at position 164 is moved 3 or 4 positions, for example, using only a fraction of the time that the conventional stocker used for retrieval of a FOUP.

It should be appreciated that the above described mechanisms and methods for storing and accessing semiconductor wafer containers are for explanatory purposes only and that the invention is not limited thereby. It should be apparent to those skilled in the art that certain advantages of these described mechanisms and methods have been achieved. It should also be appreciated that various modifications, adaptations and alternative embodiments may be made within the scope and spirit of the appended claims of the present invention.

What is claimed is:
1. A storage system, comprising:
a storage system assembly positioned at a height that is greater than a height of a tool used for handling substrates to be processed, the storage system assembly configured to locally store one or more containers of substrates before or after being processed by the tool, the storage system assembly including,
(a) a frame;
(b) a base plate coupled to the frame, the base plate includes a drive pulley, an idler pulley, a belt, a track coupled to the base plate, and a motor, the base plate is oriented to define a horizontal plane;
(c) a plurality of storage shelves, each of the plurality of storage shelves have shelf plates with a plurality of shelf features for supporting a container, and each of the plurality of storage shelves being coupled to the belt to enable movement and being coupled to the track to enable guiding to one or more positions;
wherein the motor is coupled to the drive pulley for moving the belt, such that each of the plurality of storage shelves move together along the track to the one or more positions, the track having at least some sections that are linear and some sections that are nonlinear and the sections are arranged in a loop over the base plate;
wherein the frame of the storage system assembly is coupled to and is positioned above a frame assembly of the tool; and

(d) an active port assembly connected to the frame of the storage system assembly, the active port assembly having a port plate, the port plate having a plurality of port features, the port plate positioned at one of the positions along the track, the active port assembly further including,
  (i) a horizontal motion assembly defining an extended position outside of the frame of the storage system assembly and a retracted position inside the frame of the storage system assembly; and
  (ii) a vertical motion assembly, the vertical motion assembly being coupled to the port plate, and the vertical motion assembly defining an up position and a down position, the horizontal motion assembly being coupled to the vertical motion assembly;
wherein the down position places the port plate under one of the shelf plates;
wherein the up position places the port plate above one of the shelf plates.

2. The storage system of claim 1, wherein one of the shelf plates is positionable in a complementary relationship with the port plate, so as to place the shelf features and the port features proximate to each other.

3. The storage system of claim 1, wherein the port plate being in the retracted position and in the up position enables lifting a container present on the shelf features of the shelf plate onto the port features of the port plate.

4. The storage system of claim 1, wherein the port plate being in the retracted position and in the down position enables unobstructed movement of the storage shelves along the track to the one or more positions.

5. The storage system of claim 1, wherein the active port assembly includes a C-shape space, the C-shape space provides a location for one of the shelf plates.

6. The storage system of claim 1, wherein the port plate has an opening on one side, the opening being larger than a size of one of the shelf plates, and wherein the port features and the shelf features are proximate to each other to enable engagement to a slot location of a base of a container.

7. The storage system of claim 1, wherein the belt is a chain with links or a molded belt, and the drive and idler pulleys are sprockets or disks.

8. The storage system of claim 7, wherein when the drive and idler pulleys are sprockets and the belt is a chain, each of the storage shelves is coupled to the chain at a set position, such that each of the storage shelves move together.

9. The storage system of claim 1, wherein the tool being at least one load port that is interfaced to one or more substrate processing tools.

10. The storage system of claim 1, wherein the tool includes a load port with a load port shelf that extends away from the load port into a container load zone, and wherein the port plate defined in the extended position places the port plate in the container load zone,
wherein the port plate in the extended position is above the load port shelf.

11. The storage system of claim 10, further comprising:
a transfer hoist defined over the frame of the storage system assembly, the transfer hoist defined to extend away from the storage system assembly in a direction of the port plate when in an extended position and in a direction of the load port shelf when in a retracted position, the transfer hoist configured to,
  (i) pick or place containers to or from the port plate when the transfer hoist is in the extended position; or
  (ii) pick or place containers to or from the load port shelf when the transfer hoist is in the retracted position.

12. The storage system of claim 11, further comprising a linear drive for horizontally moving the transfer hoist over the port plate when the transfer hoist is in the extended position and over the load port shelf when the transfer hoist is in the retracted position.

13. The storage system of claim 1, wherein the storage system assembly is positioned below an overhead transfer vehicle (OHT).

14. The storage system of claim 13, wherein a path of the OHT can deliver or remove containers directly from one of the storage shelves.

15. The storage system of claim 13, wherein a path of the OHT can deliver or remove containers directly from one of the storage shelves, from the port plate in the extended position, from the port plate in the retracted and up position, or from a shelf of the tool.

16. The storage system of claim 1, wherein the storage system assembly is positioned below an overhead transfer vehicle (OHT).

17. The storage system of claim 1, wherein more than one active port assembly is connected to the frame and positioned at different positions along the track.

18. The storage system of claim 17, wherein each of the active port assemblies are positioned on a same side or different sides of the frame.

19. The storage system of claim 18, wherein one or more overhead transfer vehicle (OHT) interfaces with one or more active port assemblies defined on the same side or different sides of the frame.

20. The storage system of claim 1, wherein one of the storage shelves includes rollers attached to the track or bearings attached to the track.

21. The storage system of claim 1, wherein two or more storage system assemblies are stacked above the tool, each storage system assembly defining a level.

22. A storage system, comprising:
a storage system assembly positioned at a height that is greater than a height of a tool used for loading and unloading substrates to be processed, the storage system assembly configured to locally store one or more containers of substrates in a horizontal plane and a frame of the storage subsystem assembly is coupled to and is positioned above a frame assembly of the tool, the storage system assembly including,
  (a) a plurality of storage shelves, each of the plurality of storage shelves have shelf plates with a plurality of shelf features for supporting a container, and each of the storage shelves being coupled to a belt to enable horizontal movement and each of the storage shelves being coupled to a rail to enable guiding to one or more positions in the horizontal plane;
  (b) a motor coupled to a drive pulley for moving the chain, such that each of the plurality of storage shelves move together along the rail to the one or more positions, the rail having at least some sections that are linear and some sections that are nonlinear and the sections are arranged in a loop; and
  (c) an active port assembly having a port plate, the port plate having a plurality of port features, the port plate positioned at one of the positions along the rail, the active port assembly including,
    (i) a horizontal motion assembly defining an extended position and a retracted position; and
    (ii) a vertical motion assembly coupled to the port plate, and the vertical motion assembly defining an up position and a down position, the horizontal motion assembly being coupled to the vertical motion assembly, wherein the port plate has an opening on one side, the opening being larger than a size of a corresponding one of the shelf plates, and wherein the port features and the shelf features are positionable proximate to each other to enable engagement to a plurality of slot locations of a base of a container.

23. The storage system of claim 22, wherein the belt is a chain with links or a molded belt, and the drive pulley is a sprocket or disk.

24. A storage system of claim 22, wherein the retracted position places the port plate under one of the shelf plates when in the down position, and the retracted position places the port plate above one of the shelf plates when in the up position.

25. The storage system of claim 22, wherein the port plate being in the retracted position and in the up position enables lifting the container present on the shelf features of the shelf plate onto the port features of the port plate.

26. The storage system of claim 22, wherein the port plate being in the retracted position and in the down position enables unobstructed movement of the storage shelves along the rail to the one or more positions.

27. The storage system of claim 22, wherein the active port assembly includes a C-shape space, the C-shape space provides a location for one of the shelf plates.

28. The storage system of claim 22, wherein the tool being at least one load port that is interfaced to one or more substrate processing tools.

29. The storage system of claim 22, wherein the tool includes a load port with a load port shelf that extends away from the load port into a container load zone, and wherein the port plate defined in the extended position places the port plate in the container load zone, wherein the port plate in the extended position is above the load port shelf.

30. The storage system of claim 29, further comprising:
a transfer hoist defined over the storage system assembly, the transfer hoist defined to extend away from the storage system assembly in a direction of the port plate when in an extended position and in a direction of the load port shelf when in a retracted position, the transfer hoist configured to,
(i) pick or place containers to or from the port plate when the transfer hoist is in the extended position; or
(ii) pick or place containers to or from the load port shelf when the transfer hoist is in the retracted position.

31. The storage system of claim 30, further comprising a linear drive for horizontally moving the transfer hoist over the port plate when the transfer hoist is in the extended position and over the load port shelf when the transfer hoist is in the retracted position.

32. The storage system of claim 30, wherein the storage system assembly is positioned below an overhead transfer vehicle (OHT).

33. The storage system of claim 32, wherein a path of the OHT can deliver or remove containers directly from one of the storage shelves or the port plate.

34. The storage system of claim 22, wherein more than one active port assembly is connected to the storage system assembly and positioned at different positions along the rail.

35. The storage system of claim 34, wherein each of the active port assemblies are positioned on a same side or different sides of the frame.

36. The storage system of claim 34, wherein one or more overhead transfer vehicle (OHT) interfaces with one or more active port assemblies defined on the same side or different sides of the storage system assembly.

* * * * *